(12) United States Patent
Inoue

(10) Patent No.: US 6,785,005 B2
(45) Date of Patent: Aug. 31, 2004

(54) SWITCHING TYPE DUAL WAFER STAGE

(75) Inventor: Fuyuhiko Inoue, San Mateo, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/960,585

(22) Filed: Sep. 21, 2001

(65) Prior Publication Data

US 2003/0063289 A1 Apr. 3, 2003

(51) Int. Cl.$^7$ ................................................ G01B 9/02
(52) U.S. Cl. ................................................ 356/500
(58) Field of Search ........................ 356/486, 487, 356/493, 496, 498, 500; 250/559.29, 559.3

(56) References Cited

U.S. PATENT DOCUMENTS

| | | | |
|---|---|---|---|
| 4,215,938 A | 8/1980 | Farrand et al. | |
| 5,114,234 A | 5/1992 | Otsuka et al. | |
| 5,151,749 A | 9/1992 | Tanimoto et al. | |
| 5,187,543 A | 2/1993 | Ebert | |
| 5,365,342 A | 11/1994 | Ayata et al. | |
| 5,379,115 A | 1/1995 | Tsai | |
| 5,392,120 A | 2/1995 | Kamiya | |
| 5,504,407 A | 4/1996 | Wakui et al. | 318/568.17 |
| 5,523,839 A | 6/1996 | Robinson et al. | |
| 5,528,118 A | 6/1996 | Lee | |
| 5,537,209 A | 7/1996 | Lis | |
| 5,677,758 A | 10/1997 | McEachern et al. | 355/75 |
| 5,715,064 A | 2/1998 | Lin | 356/401 |
| 5,724,136 A | 3/1998 | Zanoni | |
| 5,790,253 A | 8/1998 | Kamiya | |
| 5,969,441 A | 10/1999 | Loopstra et al. | 310/12 |
| 5,991,034 A | 11/1999 | Ohtsuka | |
| 6,020,964 A | 2/2000 | Loopstra et al. | |
| 6,118,515 A | 9/2000 | Wakamoto et al. | |
| 6,262,796 B1 | 7/2001 | Loopstra et al. | |
| 6,313,918 B1 | 11/2001 | Hill et al. | |
| 6,400,441 B1 | 6/2002 | Nishi et al. | |
| 6,417,914 B1 | 7/2002 | Li | |
| 2002/0026878 A1 | 3/2002 | Kwan et al. | |
| 2003/0076482 A1 | 4/2003 | Inoue | |

FOREIGN PATENT DOCUMENTS

| | | |
|---|---|---|
| EP | 1 041 357 A1 | 10/2000 |
| WO | WO 98/06009 | 2/1998 |
| WO | WO 98/40791 | 9/1998 |
| WO | WO 99/32940 | 7/1999 |

OTHER PUBLICATIONS

Van Zant, "Microchip Fabrication, A Practical Guide to Semiconductor Processing", Fourth Edition, McGraw–Hill, pp. 236 and 611.

Primary Examiner—Samuel A. Turner
Assistant Examiner—Michael A. Lyons
(74) Attorney, Agent, or Firm—Morgan Lewis & Bockius LLP

(57) ABSTRACT

This invention relates to an apparatus and method for positioning dual stages during semiconductor wafer processing. More particularly, the invention facilitates the use of interferometers to determine the positions of both wafer stages at all times during processing. While the movement of a typical twin stage apparatus causes one of the stages to eclipse the other and requires the addition of a significant number of additional interferometers, this invention minimizes the number of interferometers necessary through dimensioning the stages so that one stage never totally eclipses the other.

28 Claims, 26 Drawing Sheets

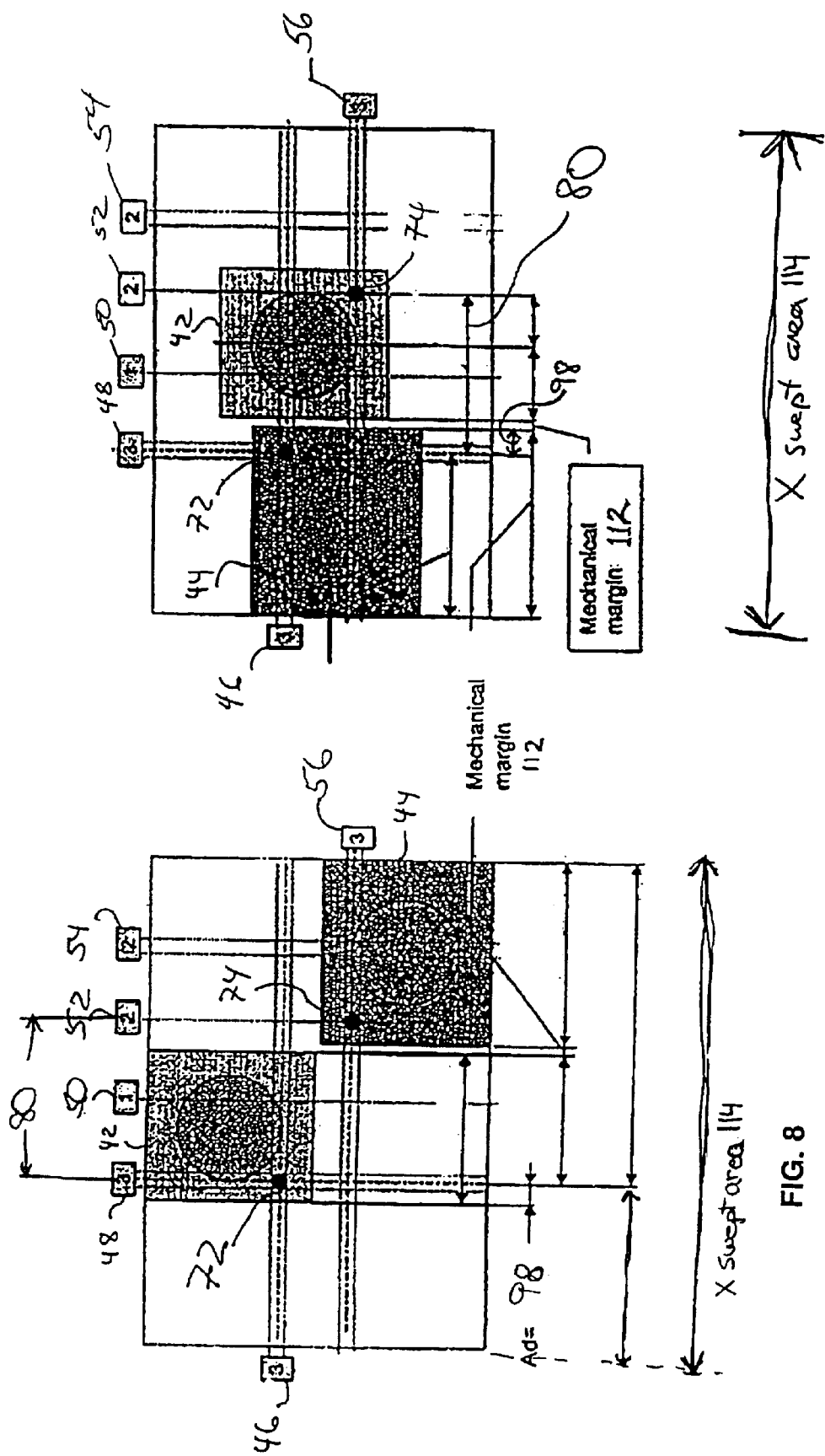

SWITCHING TYPE DUAL WAFER STAGE

FIELD OF THE INVENTION

The invention relates to lithography instruments used for patterning and processing substrates such as semiconductor chips and wafers. More specifically, the invention is concerned with an apparatus and method for using interferometers to determine the position of substrate stages during the simultaneous processing of the substrates affixed to these stages.

BACKGROUND OF THE INVENTION

Lithography processes require positioning a reticle between an electron beam and the substrate chip or wafer. System throughput is dependent upon the speeds of many separate processes that are performed in series. Throughput is therefore dependent on the duration of each process.

In a typical modern lithography process an individual wafer undergoes a number of sub-processes. These can include: loading, field image alignment, global alignment, and exposure. The production of an acceptable final product requires the complex interaction of the systems necessary to implement each sub-process. For example, in the sub-process for exposing patterns on wafers and other substrates, the reticle is moved at high speeds between discrete and precise positions to facilitate focusing the image on the substrate. This motion can generate dynamic reaction forces where the reticle is supported, leading to distortion of the reticle and, hence, distortion of the image focused on the substrate. Both reticle and wafer must be held without slippage and in a way that does not cause distortion of the reticle pattern. The system is further complicated by the fact that lithography processes typically occur in a clean room/vacuum environment; this is also an indication of the sensitivity of the processes.

A typical exposure apparatus 10 employing a single wafer stage is shown in FIG. 1 and FIG. 2. Exposure apparatus 10 transfers a pattern of an integrated circuit from reticle 12 onto semiconductor wafer 14. Apparatus frame 16 preferably is rigid and supports the components of exposure apparatus 10. These components include: reticle stage 18, wafer stage 20, lens assembly 22, and illumination system 24. Alternatively, separate, individual structures (not shown) can be used to support wafer stage 20, reticle stage 18, illumination system 24, and lens assembly 22.

Illumination system 24 includes an illumination source 26 and an illumination optical assembly 28. Illumination source 26 emits an exposing beam of energy such as light or electron energy. Optical assembly 28 guides the beam from illumination source 26 to lens assembly 22. The beam illuminates selectively different portions of reticle 12 and exposes wafer 14. In FIG. 1, illumination source 26 is illustrated as being supported above reticle stage 18. Typically, however, illumination source 26 is secured to one of the sides of apparatus frame 16 and the energy beam from illumination source 26 is directed to above reticle stage 18 with illumination optical assembly 28. Where illumination source 26 is an electron beam, the optical path for the electron beam should be in a vacuum.

Lens assembly 22 projects and/or focuses the light passing through reticle 12 to wafer 14. Depending upon the design of apparatus 10, lens assembly 22 can magnify or reduce the image illuminated on reticle 12.

Reticle stage 18 holds and precisely positions reticle 12 relative to lens assembly 22 and wafer 14. Similarly, wafer stage 20 holds and positions wafer 14 with respect to the projected image of the illuminated portions of reticle 12. In the embodiment illustrated in FIG. 1 and FIG. 2, wafer stage 20 and reticle stage 18 are positioned by shaft-type linear motors 30. Depending upon the design, apparatus 10 may include additional servo drive units, linear motors and planar motors to move wafer stage 20 and reticle stage 18, but other drive and control mechanisms may be employed.

The basic device as described may be used in different types of lithography processes. For example, exposure apparatus 10 can be used in a scanning type lithography system, which exposes the pattern from reticle 12 onto wafer 14 with reticle 12 and wafer 14 moving synchronously. In a scanning type lithography process, reticle 12 is moved perpendicular to an optical axis of lens assembly 22 by reticle stage 18, and wafer 14 is moved perpendicular to an optical axis of lens assembly 22 by wafer stage 20. Scanning of reticle 12 and wafer 14 occurs while reticle 12 and wafer 14 are moving synchronously.

Alternatively, exposure apparatus 10 may be employed in a step-and-repeat type lithography system that exposes reticle 12 while reticle 12 and wafer 14 are stationary. In the step-and-repeat process, wafer 14 is in a constant position relative to reticle 12 and lens assembly 22 during the exposure of an individual field. Subsequently, between consecutive exposure steps, wafer 14 is consecutively moved by wafer stage 20 perpendicular to the optical axis of lens assembly 22 so that the next field of semiconductor wafer 14 is brought into position relative to lens assembly 22 and reticle 12 for exposure. Following this process, the images on reticle 12 are sequentially exposed onto the fields of wafer 14.

This complexity and sensitivity of the exposure apparatus and the processes involved result in a significant time expenditure for each sub-process. When a single wafer is undergoing one of these sub-processes, the mechanisms for the others are normally idle. Consumer demand for the end product has created a need for increased throughput and, thus, the development of methods to decrease the idle time. One current method uses two stages that run simultaneously, but with each stage at different steps in the process. This method relies upon a combination of encoders and interferometers to determine the position of each stage at any given point throughout processing.

Encoders, however, are less than ideal devices for this use for a number of reasons. The encoder must be placed in an area that does not interfere with the requirements of other sub-processes, such as substrate exposure. This leads to apparatus design problems in harmonizing the requirements of the encoder, interferometers, and the process. Also, encoders are less precise than interferometers. Precision in planar placement of the stage is necessary, since errors in reticle or wafer position result in similar errors in the final product and, therefore, reduced functionality of that final product.

SUMMARY OF THE INVENTION

The present invention provides a dual stage assembly and method where stage position may be determined using interferometers. The stage assembly includes a plurality of interferometers mounted on a base for determining stage positions. The two stages move between multiple positions on the base and have mirrors affixed to them that cooperate with the other interferometer components to provide position data. At times, the two stages are positioned so that the first stage eclipses the second stage with respect to said at least one of the interferometers. Whenever such an eclipse occurs, the mirror on the second (eclipsed) stage is configured to cooperate with the non-eclipsed interferometers so that the position of said second stage is continuously determinable. This is achieved by appropriately dispersing the interferometers about one side of the base and by causing the mirror on the second stage to extend from behind the eclipsing shadow of the first stage. In a preferred embodiment, the second stage is the same size as the first and merely supports the larger mirror. In another preferred embodiment, the second stage is approximately the same size as the mirror in the relevant dimensions. In both the previously mentioned preferred embodiments the stages are the same size in the direction parallel to the axes of the interferometers. But the invention could also be practiced in two dimensions resulting in the need for interferometers on only two orthogonal sides of the base.

A method incorporating the invention comprises: sizing the stages based on wafer and exposure apparatus parameters; dispersing interferometers about the sides of the base at appropriate positions based on the stage sizes; configuring the mirror on the second stage to continue to cooperate with enough other interferometer elements to provide position data even if the first stage is positioned between the second stage and some of the interferometers; moving the stages as desired during the course of using the exposure apparatus; and determining the positions of both stages at all times during the process. A preferred embodiment of the invention practices the method with respect to one dimension of the apparatus; resulting in interferometers on three sides of the base. Another embodiment of the invention practices the method with respect to both dimensions of the plane of movement; resulting in interferometers on two orthogonal sides of the base.

BRIEF DESCRIPTION OF THE DRAWINGS

The foregoing and other aspects and advantages will be better understood from the following detailed description of the preferred embodiment of the invention with reference to the drawings, in which:

FIG. 4a is a top view of a first wafer stage;

FIG. 4b is an enlarged detail view of portion B of the first wafer stage shown in FIG. 4a.

FIG. 8 illustrates a first position involved in determining the X swept area of dual wafer stage assembly 40 in example 1;

FIG. 9 illustrates a second position involved in determining the X swept area of dual wafer stage assembly 40 in example 1;

DETAILED DESCRIPTION OF THE INVENTION

Figure 3A:
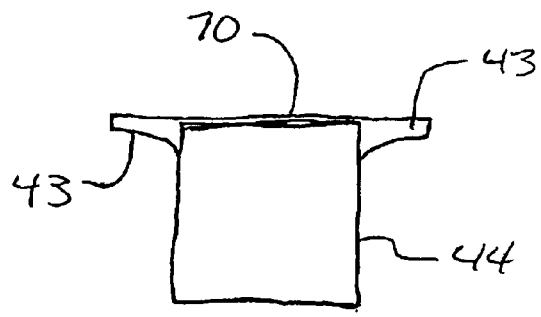
FIG. 3a is a schematic plan view of an alternative embodiment of a stage according to the invention.
Figure 3:
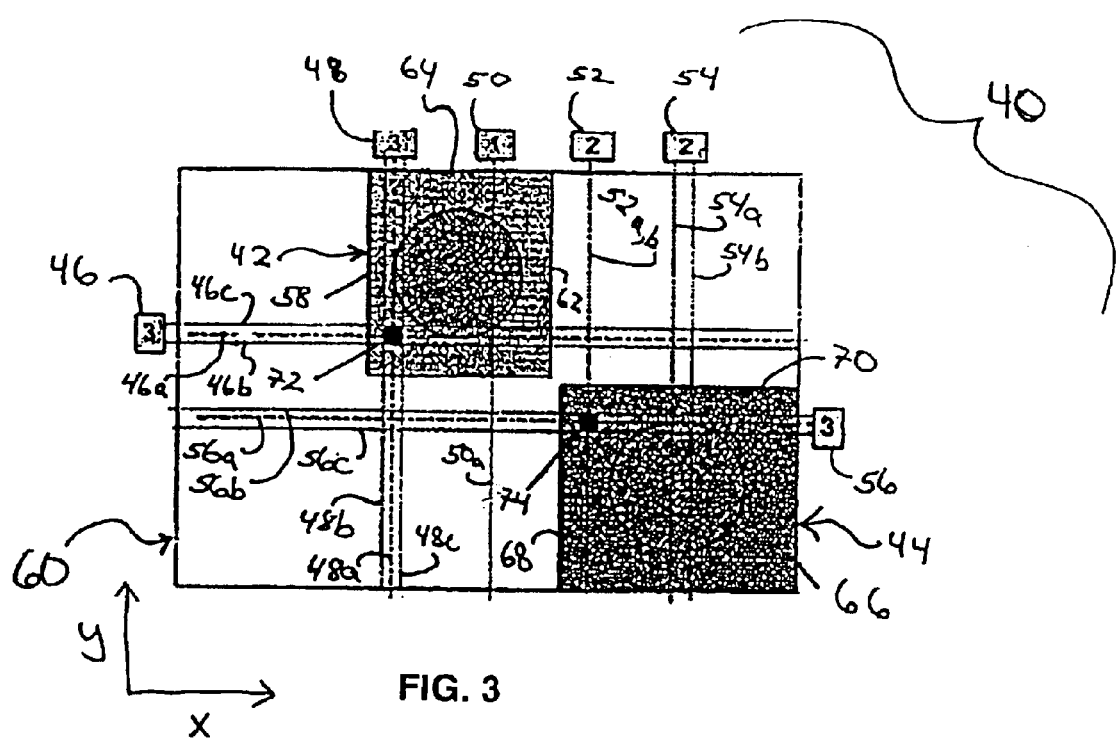
FIG. 3 is a top view of a dual wafer stage assembly incorporating a preferred embodiment of the present invention.

Referring now to FIG. 3, dual wafer stage assembly 40 is illustrated from above according to a preferred embodiment of the invention. This invention minimizes the number of interferometers necessary for positioning by configuring the stages according to the invention so that one stage never totally eclipses the other. Dual wafer stage assembly 40 provides the capability for the system to rely on interferometers 46, 48, 50, 52, 54, 56 to determine the position of wafer stages 42, 44 during processing. Dual wafer stage assembly 40 generally comprises a first wafer stage 42, a second wafer stage 44, a base 60, and the interferometers mentioned above. Each interferometer cooperates with a reflective surface (mirror) 58, 62, 64, 66, 68, 70 mounted on stages 42, 44 so that they reflect back to the intended interferometer.

As shown in FIG. 3, focal point 72 refers to the point where the image from reticle 12 is focused by the projection apparatus onto stage 40. Area 74 identifies an area that an operator views from above (typically with a microscope) to determine if the wafer is properly aligned. This area is referred to as the field image alignment area or point. Interferometer 50 is positioned approximately midway between projection lens 72 and field image alignment point 74 in the X-direction and is used for control when stages 42, 44 are moving in the Y-direction. Interferometer 54 is positioned to determine stage location during loading (stage safety position) as illustrated.

Mirrors 58, 62, 64, 66, 68, 70 are known as "moving mirrors" because they move with wafer stages 64, 66. As is understood by persons skilled in the art, other non-moving mirrors known as "reference mirrors" are located within the interferometers 46, 48, 56, 52, 50 and 54, but in order to clarify the schematic representation of the invention standard reference beams, reference mirrors, and sensors for each interferometer are not shown.

Figure 1:
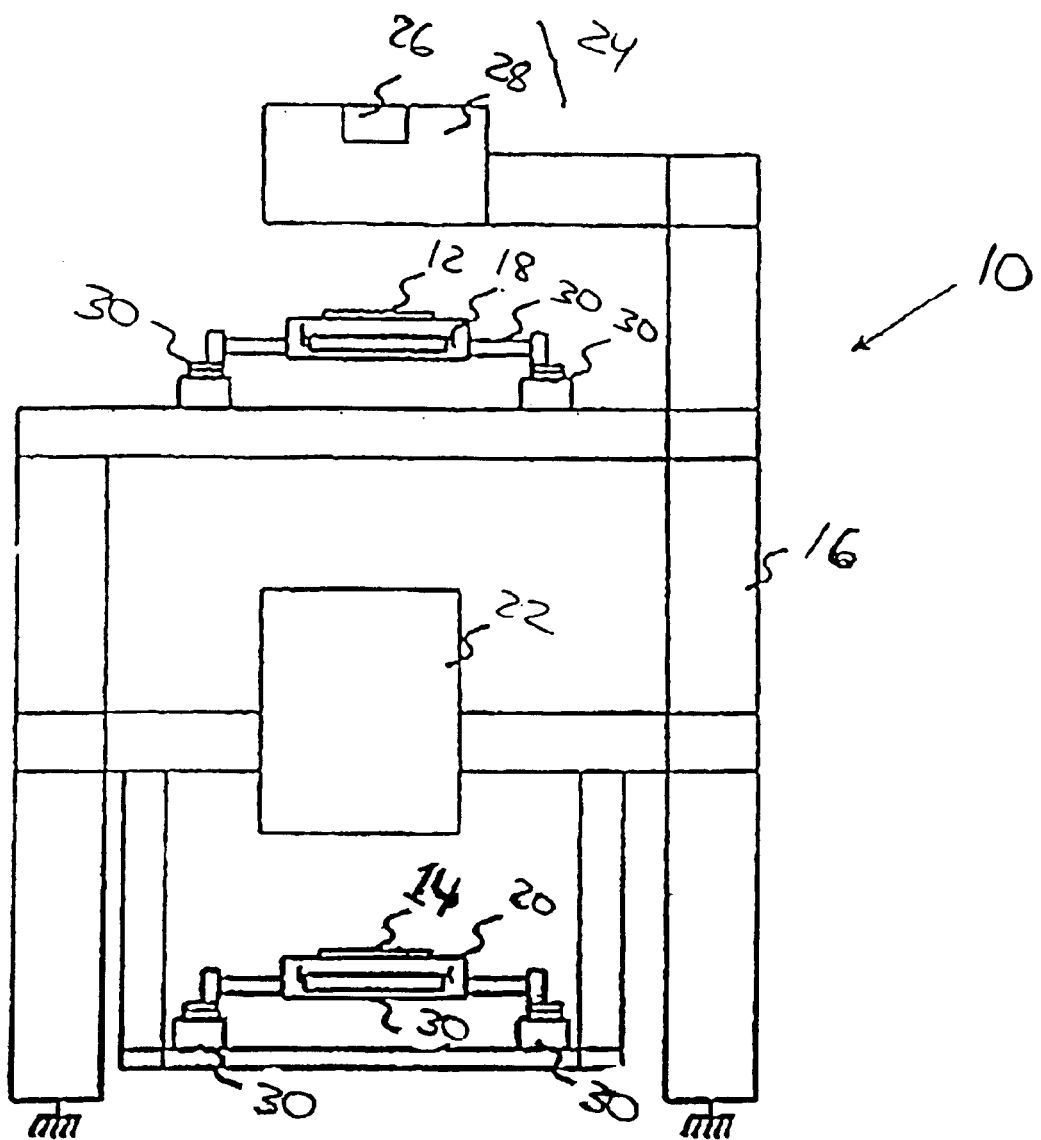
FIG. 1 is a side view of a lithography exposure apparatus of the prior art.
Figure 2:
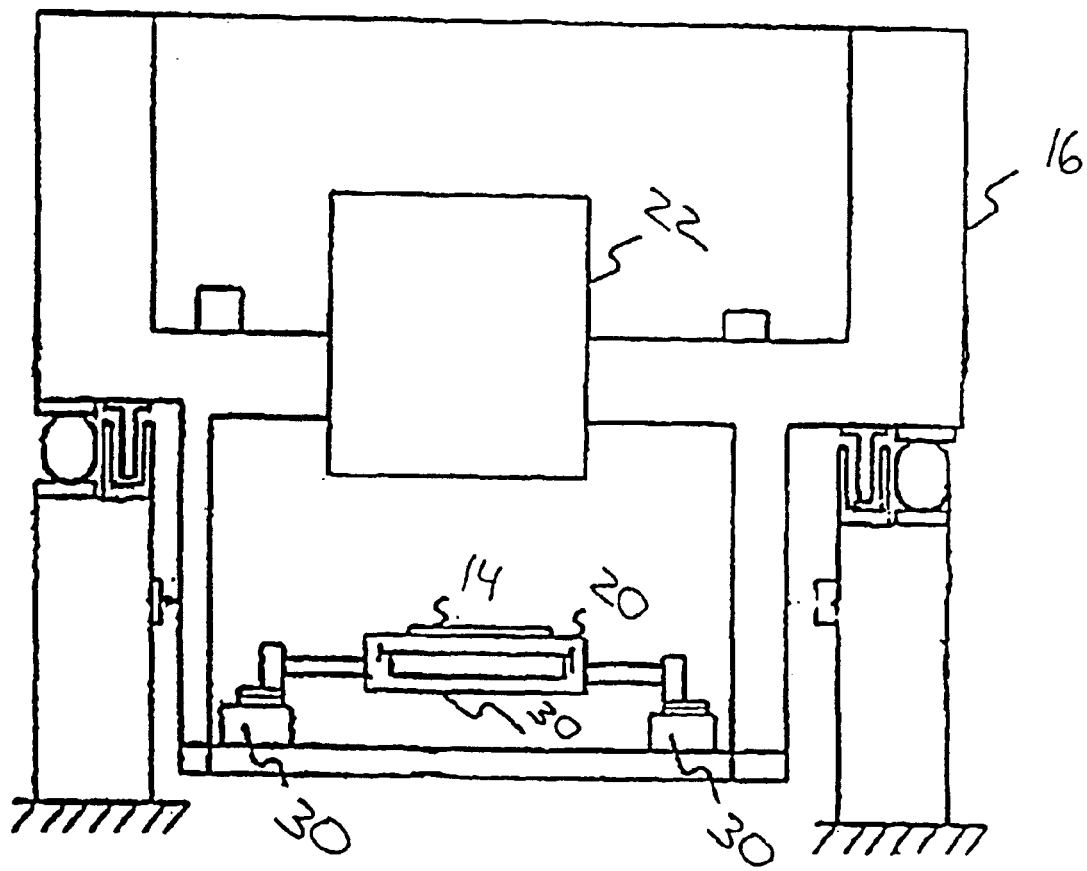
FIG. 2 is a different side view of a lithography exposure apparatus of the prior art.

Elements of base 60 necessary for the support, positioning, and movement of wafer stages 42, 44 are also not illustrated in FIG. 3 for purposes of clarity, but as one of skill in the art would recognize, these functions may be accomplished by the shaft-type linear motors 30 or other known actuators and additional static support elements of the prior art (see FIGS. 1 & 2). Also, the individual axes (beams) of interferometers 46, 48, 56, 52, 50 and 54 are configured and utilized either singularly or in combination to make possible the measurements necessary at any particular moment. For example, although the single beam of interferometer 50 is primarily used to determine Y position of wafer stage A when switching in the Y direction, it is also used at times in conjunction with interferometer 52 to determine the stage A yaw. In a preferred embodiment, the present invention employs one, two, and three axes interferometers that are incident on dual wafer stages 42, 44 from three sides to determine wafer stage position at all times. As shown in FIGS. 12(a)–(d), the axes of the interferometers are directed in parallel towards the moveable mirrors on stages 42, 44, but are arranged to provide position data from different points on the moveable mirrors. Position data from one axis may therefore be combined with position data from one or more other axes and manipulated to yield stage yaw and pitch. As is well known to one of skill in the art, the spacing between axes necessary for them to combine to yield yaw and pitch data is infinitely variable in three dimensions so long as the beam is incident upon the desired mirror.

Continuing with FIG. 3, and viewing the interferometers in more detail in FIG. 12, interferometers 46, 48, 56 each have 3 axes 46a, 46b, 46c, 48a, 48b, 48c, 56a, 56b, 56c and is capable of determining X position, yaw, and pitch. Interferometers 52, 54 each have 2 axes 52a, 52b, 54a, 54b and is capable of determining Y position and pitch. Interferometer 50 has one axis 50a and is capable of determining Y position, but if roll and pitch control are also required in addition to the X position, Y position, and yaw control, then interferometer 50 preferably has 2 axes and is capable of determining Y position and pitch, similar to interferometer 52. If roll and pitch control are also required in addition to the X position, Y position, and yaw control, then interferometer 54 preferably has 3 axes and is capable of determining Y position, yaw, and pitch. In this preferred embodiment the minimum number of axes necessary to implement the invention is 14, as shown in FIG. 14.

In a preferred embodiment shown in FIG. 3 interferometers 46, 48, 52, and 56 are directed so their axes determine the positions of wafer stages 42, 44 closest to the most significant areas. Interferometers 46, 48 intersect at focal point 72 where the projection lens focuses the image from the reticle. Interferometers 56 and 52 similarly intersect at field image alignment point 74. In order to prevent all of interferometers 48, 50, 52, 54 from being eclipsed by first stage 42 whenever it is positioned between second wafer stage 44 and said interferometers, second stage 44 is preferably larger in the X-direction than first stage 42. Thus, moving mirrors positioned on second stage 44 that cooperate with interferometers 48, 50, 52, 54 are at least in part disposed at peripheral edge portions of the second stage so as to be accessible to the interferometers around the first stage. In a preferred embodiment, these moving mirrors comprise a single, continuous mirror that extends along the entire side of the stage to permit interferometer readings at any point. Alternatively, rather than increasing the size of the stage as a whole, it will be appreciated that extension structures 43 may be provided on second stage 44' to carry the moving mirror(s) as schematically illustrated in FIG. 3a.

By properly placing the interferometers and configuring the stages or the moveable mirrors mounted on the stages, this invention provides a dual wafer stage assembly that positions the stages with the precision of the interferometer, while only requiring the interferometers be mounted on three sides of the stages. The principals of the present invention are further illustrated by the following example. This example describes one possible preferred embodiment for illustrative purposes only, the example does not limit the scope of the invention as set forth in the appended claims.

EXAMPLE 1

The following example describes the sizing of the stages in an exemplary embodiment according to the present invention using equations (1)–(17). In this example, as illustrated in FIG. 3, the X direction dimensions of the first and second stages are different, but the Y direction dimension of each is the same. One of skill in the art will understand that the present invention can be practiced with stage dimensions of infinite variety. This is due to the different potential ranges of values possible for each of the variables and the changes possible with the configurations of the stages, mirrors, and other elements. In particular, depending on a preferred orientation of interferometers, the Y direction dimension of either the first or second stage may be larger than that of the other stage in accordance with the teachings set forth herein.

Figures 4A, 4B:
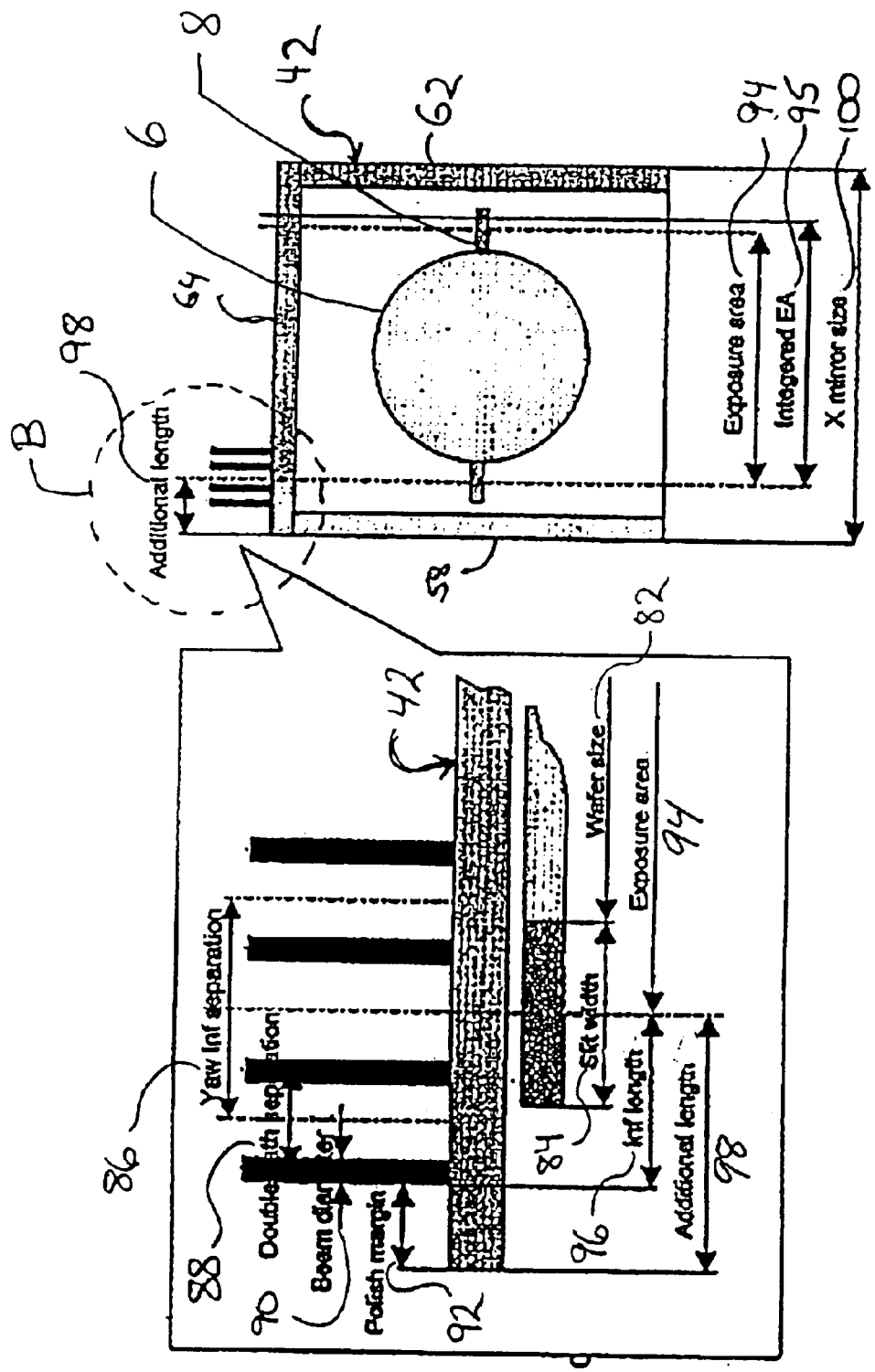

The dimensions of first wafer stage 42 are now described with reference to FIGS. 4a and 4b. In FIG. 4a, wafer 6 is illustrated positioned on stage 42 and a projection on the stage of the exposure slit of the exposure apparatus is represented by outline 8. As is known in the art, the X dimension of mirror 64 may be determined based on the wafer size and slit width, as well as certain other parameters as explained below. In this example, it is assumed that the stage 42 size is the same as the size of mirror 64 in the X direction. Also, in FIGS. 4–6, 10, and 11 the actual interferometer axes are depicted as thick lines, such as beam diameter 90 in FIG. 4a, while the virtual path of the interferometer is a thin dotted or solid line used in the remainder of the figures.

In an exemplary embodiment, as shown in FIGS. 4–7, the predetermined parameters are:

| | |
|---|---|
| 300 mm | Wafer size (WS) 82 |
| 25 mm | Slit width (SW) 84 |
| 26.2 mm | Yaw separation (YS) 86 |
| 13.1 mm | Double path separation (DPS) 88 |
| 6 mm | Beam diameter (BD) 90 |
| 5 mm | Polishing margin (PM) 92 |
| 4 | n value chosen for New bow correction (NBC) |

The X direction mirror size may be determined by solving the following five equations:

Exposure area (EA) 94=WS+SW  Eq. (1)

NBC=YS/n  Eq. (2)

Integered exposure area (IEA) 95=NBC*(Int(EA/NBC)+1)  Eq. (3)

Additional length (AL) 98=(YS/2+DPS/2+BD/2+PM)  Eq. (4)

X Mirror size (XMS) 100=IEA+2*AL  Eq. (5)

As shown in FIG. 4b, exposure area 94 is the area that is swept under projection lens focal point 72. The X dimension of this area is determined by wafer size 82 and slit width 84 as Eq. (1) shows. Yaw separation 86 is the distance interferometer axes must be separated to accurately determine wafer stage 42 and 44 yaw. Integered exposure area 95 is based on yaw separation 86, exposure area 94, and NBC as shown in Eq. (3). For a discussion of the new bow correction, see U.S. Pat. No. 5,790,253, which describes the conventional method of correcting for curving deviations associated with mirror imperfections, and is incorporated by reference. In this conventional method, when measuring linearity errors of a moving mirror by means of a laser interferometer having two measuring length axes, the bow correction is made by shifting the moving mirror by less than yaw separation 86 and, therefore, the measurement points of the axes overlap. The decree of overlap is indicated by the denominator n. The linearity errors which indicate the curving of the reflecting surface of the moving mirror are then based on the relationship of adjacent measurement values. New bow correction indicates the length of mirror necessary to perform the conventional method of correcting for mirror linearity errors. It is a function of YS 86 and an arbitrary denominator n, chosen by one of skill in the art based on the resolution of the deviation correction needed and interferometer accuracy. A higher value for n is chosen where higher resolution is needed. and, therefore, n is greater than or equal to one.

Additional length 98 is based on yaw separation 86, double path separation 88, beam diameter 90, and polishing margin 92 as shown in Eq. (4). The X dimension of first wafer stage 42 is equal to its X mirror dimension and shown by Eq. (5) to be the sum of integered exposure area 95 and additional length 98 needed on each side of stage 42. In this example, given the wafer size, slit width, and other fixed parameters, solving equations (1)–(5) produces a X dimension for mirror 42 of 382.8 mm.

Figure 5:
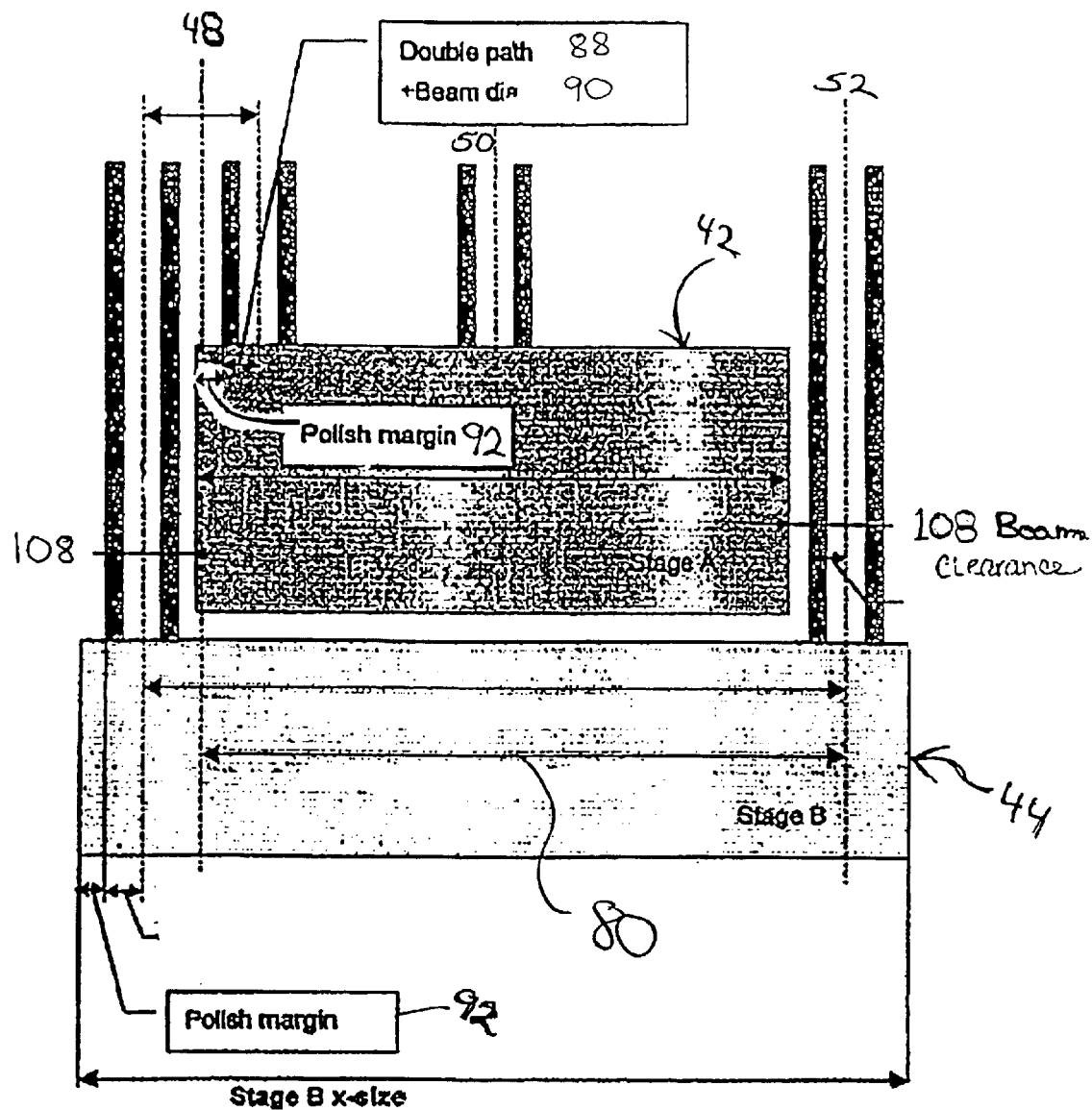
FIG. 5 is a top plan view of a first wafer stage eclipsing a second wafer stage in a preferred embodiment of the present invention.
Figure 6:
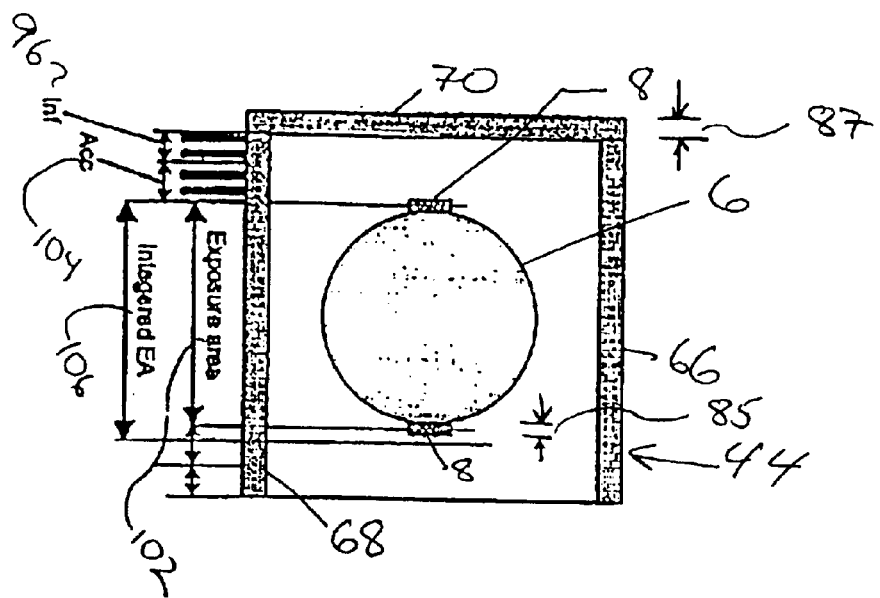
FIG. 6 is a top view of a second wafer stage in a preferred embodiment of the present invention.

Now referring to FIG. 5, this X dimension then provides the basis for calculating the X direction separation of field image alignment area 74 and interferometer 48 from focal point 72 and interferometer 52 necessary to allow stages 42 and 44 to move in the Y direction. This is baseline separation 80 and it drives the X distance between interferometers 48 and 52. Baseline separation 80 is 393 mm and is calculated:

Baseline Separation (BS) 80=Stage 42 $XMS-DPS +2*(YS-(DPS/2+BD/2)-PM)$  Eq. (6)

Given a specific first wafer stage size, the size of second wafer stage 44 is also then calculated according to the invention. More specifically, the parameter of beam clearance 108, the distance that an interferometer beam is designed to clear the wafer stage, is needed in addition to the predetermined parameters of FIG. 4b. Wafer stage 44 X mirror size may be determined by solving the following two equations:

Beam clearance (BC)=$YS-PM-2*(DPS/2+BD/2)$  Eq. (7)

Stage 44 XMS=Stage 42 $XMS+2*(DPS+BD+BC+PM)$  Eq. (8)

Second wafer stage 44 is thus made greater than first wafer stage 42 with additions to its X dimension. Each of these additions is the sum of double path separation 88, beam diameter 90, beam clearance 108, and polishing margin 92. Again it is assumed that the stage 44 size is the same as the size of mirror 70 in the X direction. Thus, for the given first stage size and predetermined parameter values, solving equations (7) and (8) produces a second wafer stage 44 X dimension of 435.2 mm.

Wafer stages 42 and 44 are the same dimension in the Y direction. In the Y direction, stage size is not equated to mirror size, unlike the X direction in this example. Computation of the Y dimension requires the additional predetermined parameters of: maximum velocity, acceleration, settling time, X mirror thickness and slit length.

| For: | 375 mm/sec | Maximum velocity |
|---|---|---|
| | 0.75 g | Acceleration |
| | 50 msec | Settling time |
| | 25 mm | X mirror thickness (MT) 87 |
| | 9 mm | Slit length (SL) 85 |

Y table size is computed using Equations (9)–(13). These equations that follow can best be understood by referring to FIG. 6. Acceleration and deceleration area 104 is determined by the maximum acceleration and velocity of wafer stages 42, 44 and the settling time required once the correct position has been reached, per Eq. (11). Interferometer length 96 is a function of yaw separation 86, double path separation 88, and beam diameter 90; parameters previously discussed with reference to FIGS. 4a, 4b, and 5. In this example, solving equations (9)–(13) gives a Y dimension of 435.9 mm.

Exposure area Y (EAY) 102=WS+SL  Eq. (9)

Acceleration and deceleration area ("Acc") 104 ("Acc")=[(Maximum velocity**2)/(2*Acceleration)+(Maximum velocity*Settling time)]  Eq. (10)

Interferometer length ("Inf") 96 ("Inf")=[YS/2+DPS/2+BD/2]  Eq. (11)

Y mirror size (YMS)=EA+2*(Acc+Inf)  Eq. (12)

Y stage size=YMS+MT  Eq. (13)

Figure 7:
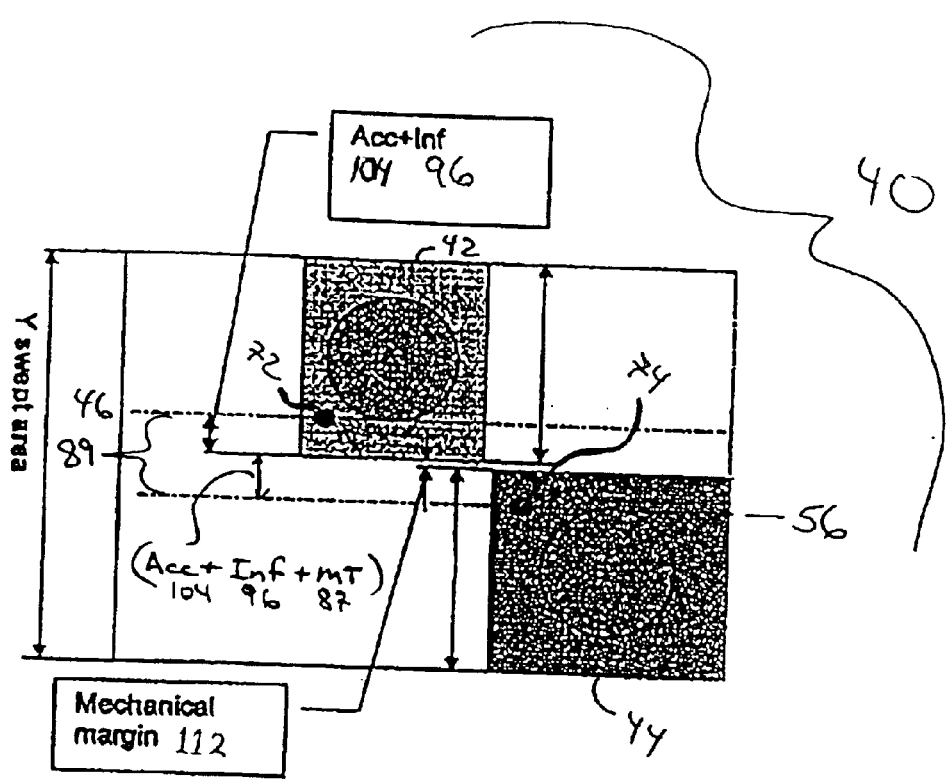
FIG. 7 is a top view of first and second wafer stages showing the Y swept area of dual wafer stage assembly 40 in example 1.

FIG. 7 illustrates the Y dimension needed for stages 42, 44 to move without contacting each other within dual wafer stage assembly 40. Interferometers and supporting structure are not shown in this diagram as this is a representation of the space necessary for the stages to move freely. The necessary distance is Y swept area 106. Mechanical margin 112 is the parameter defining the clearance between stages as they pass each other and is 24 mm, as discussed within. Y swept area 106 is determined by equation (14) to be 895.8 mm, with the Y separation of interferometers 46 and 56, or Y baseline dimension 89, determined by equation (15) to be 150.9 mm.

Y swept area=2*Y stage dimension+mechanical margin  Eq. (14)

Y Baseline Dimension (YBD) 89=2*(Acc+Inf)+MT  Eq. (15)

FIGS. 8 and 9 illustrate the X dimension needed for stages 42, 44 to move without hindrance within dual wafer stage assembly 40. X swept area 114 is the distance covered by second wafer stage 44 during the course of its movement. X swept area includes the space necessary for stage 44 to undergo field image alignment while stage 42 is being exposed, plus the baseline separation 80 of interferometers 48 and 52 (Eq. (6)), plus the area necessary for stage 44 to undergo exposure while stage 42 undergoes field image alignment. X swept area 114 is the sum of the X dimension of wafer stages 42, twice the X dimension of second wafer stage 44 and mechanical margin 112 minus additional length 98 and baseline dimension 80 as shown in Eq. (16).

X swept area 114=3*wafer stage 42 XMS/2-AL+2*MM+2*wafer stage 44 XMS-BS  Eq. (16)

Figure 10:
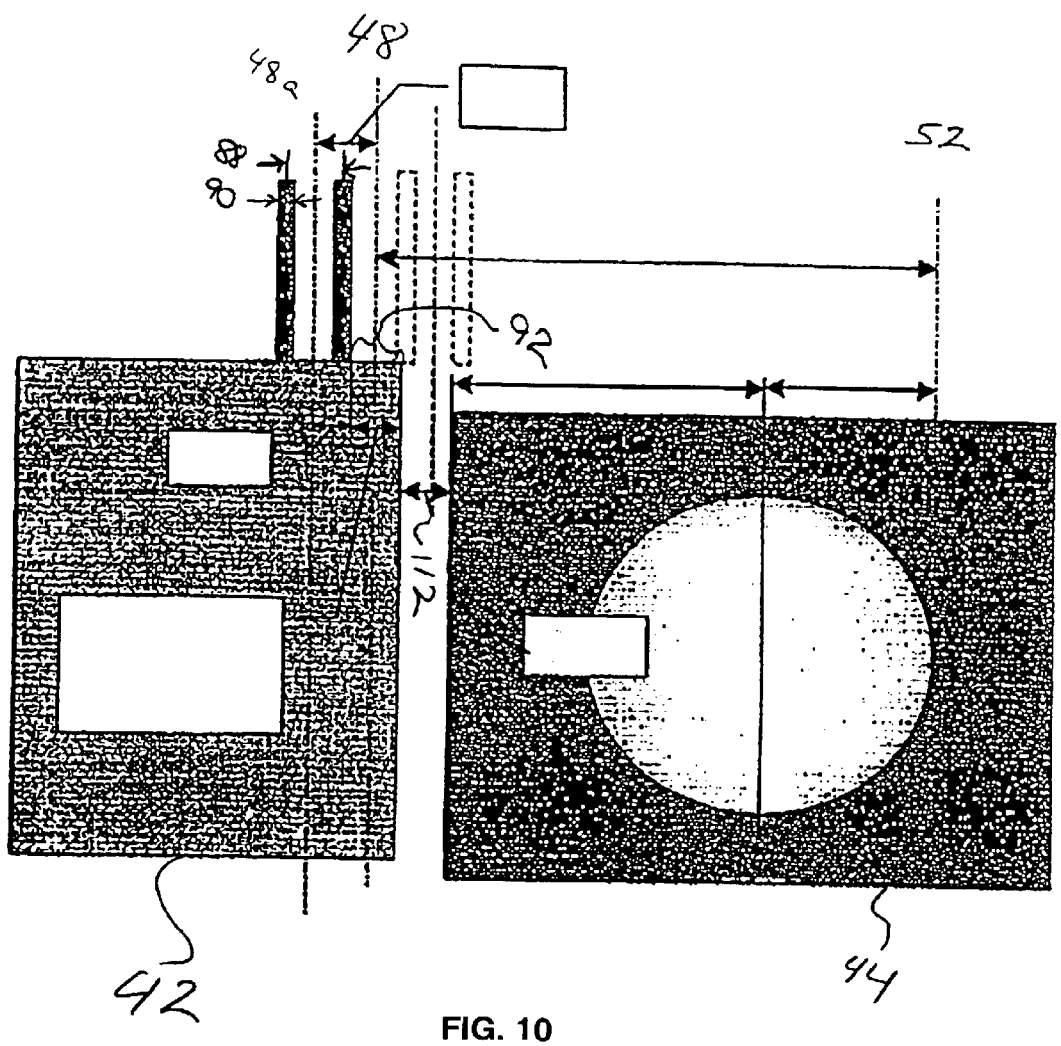
FIG. 10 illustrates the mechanical margin as described in example 1.

FIG. 10 illustrates the reasons driving mechanical margin 112 to 24 mm which are described by Eq. (17). Interferometer 48a is a dual beam interferometer. For it to function both beams must be incident on the mirror, avoiding polishing margin 92 to ensure beam coherency. If mechanical margin 112 is greater than 24 mm then interferometer 48a cannot be used for measuring first wafer stage 42 position in the safety area as shown in FIG. 14(o). Another interferometer axis would be required. A mechanical margin 112 of greater than 24 mm would result in one of the dual beams of interferometer 48 a hitting wafer stage 42 in the polishing margin 92.

MM 112=WS/2+Stage 44 XMS/2-DPS/2+BD/2-BS+PM  Eq. (17)

Figure 11:
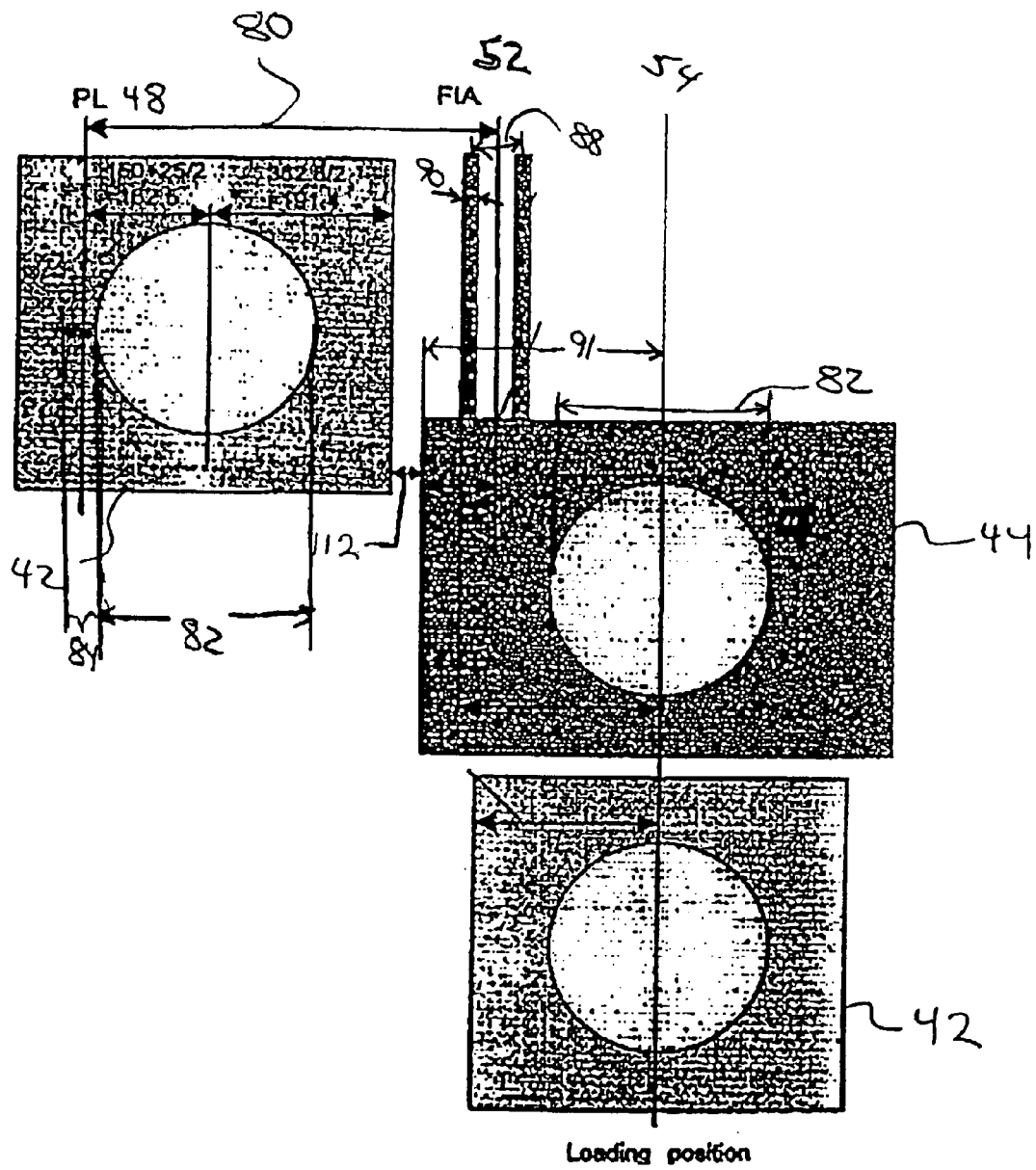
FIG. 11 illustrates an arrangement of wafer stage cover as described in example 1.
Figure 12A:
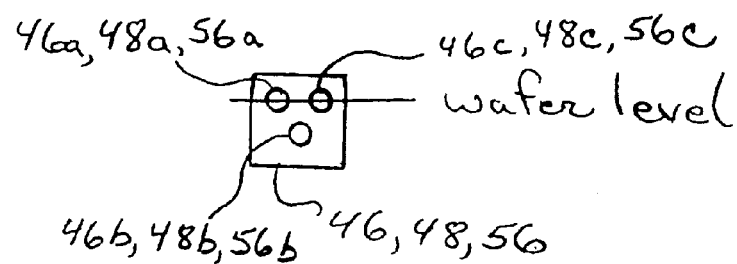
FIGS. 12(a)–(d) illustrate interferometer axes configuration in example 1.
Figure 12B:
Figure 12C:
Figure 12D:

FIG. 11 illustrates the reason why interferometer 52 cannot cover first wafer stage 42 when it is in the loading position and interferometer 54 must be added. Wafer stage 42 must be covered by interferometer 48 when in the exposure position and nearest to wafer stage 44 while wafer stage 44 is in the field image alignment position. Wafer stage 42 must also be covered by an interferometer while in the loading position. With interferometers 48 and 52 set at the baseline dimension 80 apart, and given mechanical margin 112, the center of wafer stage 44 during loading is fixed along the axis of interferometer 54 as shown. The center of wafer stage 42 must therefore also be on this axis, as the loading positions for the wafers are the same. But given the smaller size of wafer stage 42, when wafer stage 42 is in line for loading, interferometer 52 is too far from the center of wafer stage 42 to be functionally incident upon wafer stage 42, thus making interferometer 54 necessary. The left beam of double-path interferometer 52 would not be reflected by the mirror on wafer stage 42 since it is shown by Eq. (18) to be 212.05 mm from the center of the loading position. This is further than half of the X dimension of wafer stage 42, which is only 191.4 mm.

Eq. (18) Distance of interferometer 52 left beam from Wafer stage 44 center 91 = Wafer stage 44 XMS/2 − [BS − WS/2 − SW/2 − Wafer stage 42 XMS/2 − MM − DPS/2 − BD/2] = 212.05 mm FIG. 13(a)–(e) is a flowchart of a preferred method for utilizing the dual wafer stage of the present invention. This flowchart illustrates a preferred method of utilizing dual wafer stage assembly 40 of the present invention. The flowchart further illustrates interferometer use during the movement of the stages. Individual steps in the flowchart are discussed in more detail in the referenced sub-illustrations of FIG. 3 and FIG. 14(a)–(v).

Figure 14A:
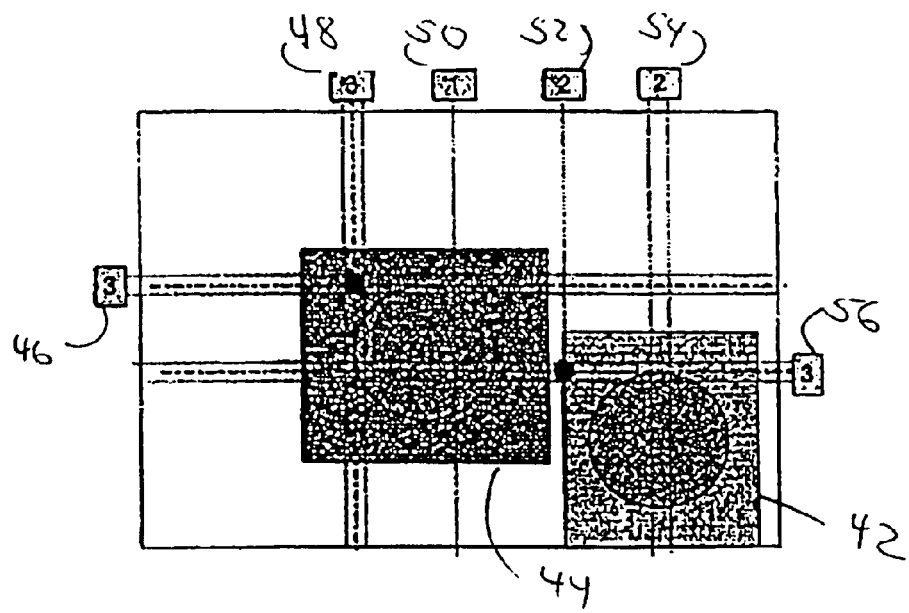
FIGS. 14(a)–(v) illustrate steps 1–22 of the method shown in FIGS. 13(a)–(c).

Referring again to FIG. 13(a), in step 200, further illustrated by FIG. 14(a), first wafer stage 42 is loading and its X position is controlled by interferometer 56a changing to interferometer 56, its Y position by interferometer 54, and Yaw is controlled by interferometer 54. Second wafer stage 44 is stopped to begin the exposure sequence if loaded with a wafer and its X position is controlled by interferometer 46, its Y position 48, and its Yaw by interferometer 48.

Figure 14B:
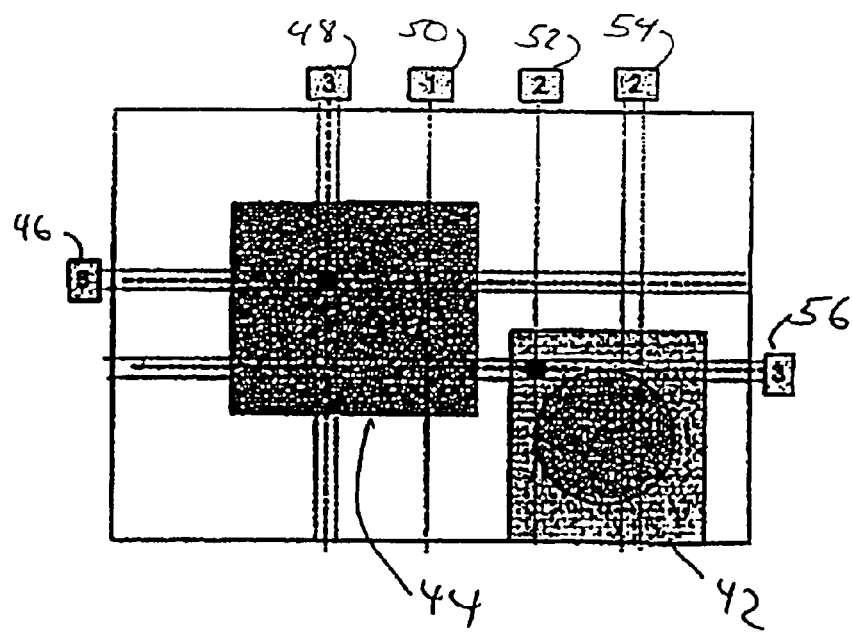

In step 202, further illustrated by FIG. 14(b), first wafer stage 42 is starting enhanced global alignment and its X position is controlled by interferometer 56, its Y position by interferometer 54 changing to interferometer 52, and Yaw is controlled by interferometer 54 changing to interferometer 56. At times stage 42 is halted to avoid disturbing the movement of stage 44. Second wafer stage 44 is in the exposure sequence if loaded with a wafer and its X position is controlled by interferometer 46, its Y position by interferometer 48, and its Yaw by interferometer 48.

Figure 14C:
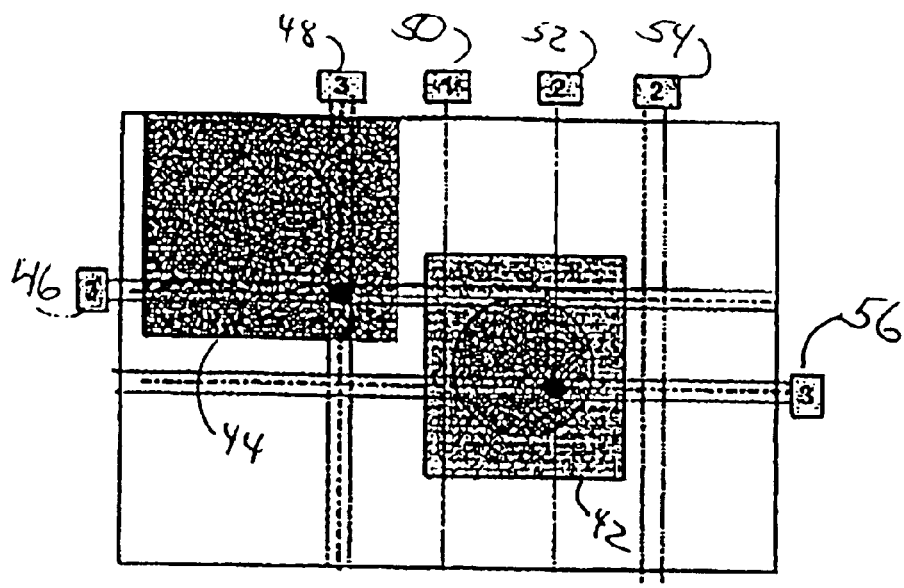

In step 204, further illustrated by FIG. 14(c), first wafer stage 42 is in enhanced global alignment and its X position is controlled by interferometer 56, its Y position by interferometer 52 changing to 50, and Yaw is controlled by interferometer 56. Second wafer stage 44 X is stopped at the end of the exposure sequence if loaded with a wafer and its position is controlled by interferometer 46, its Y position by interferometer 48, and its Yaw by interferometer 48.

Figure 14D:
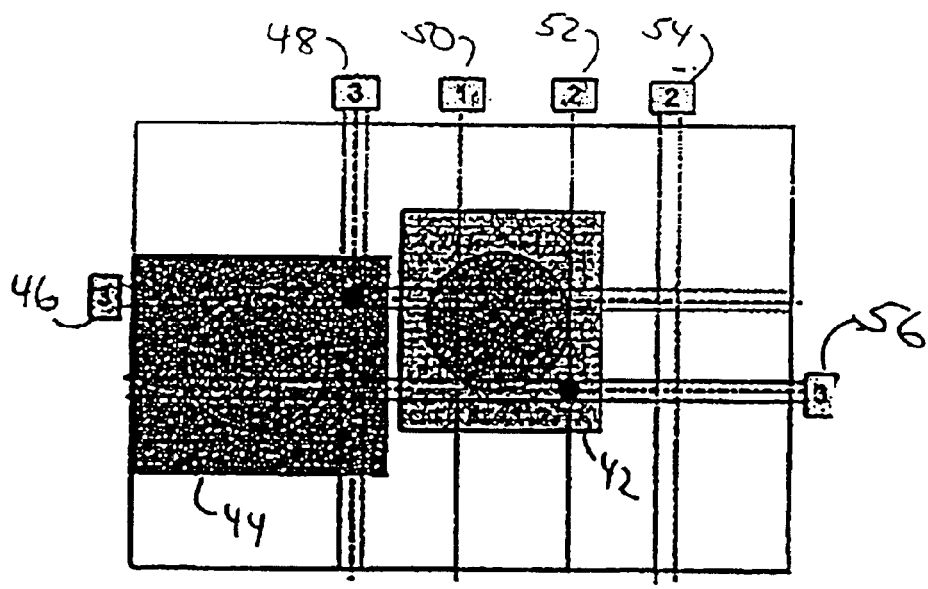

In step 206, further illustrated by FIG. 14(d), first wafer stage 42 has ended enhanced global alignment and is switching in the Y direction. Its X position is controlled by interferometer 56, its Y position by 50, and Yaw is controlled by interferometer 56 changing to interferometer 52 and 50. Second wafer stage 44 is switching in the Y direction and its X position is controlled by interferometer 46, its Y position by interferometer 48, and its Yaw by interferometer 48.

Figure 14E:
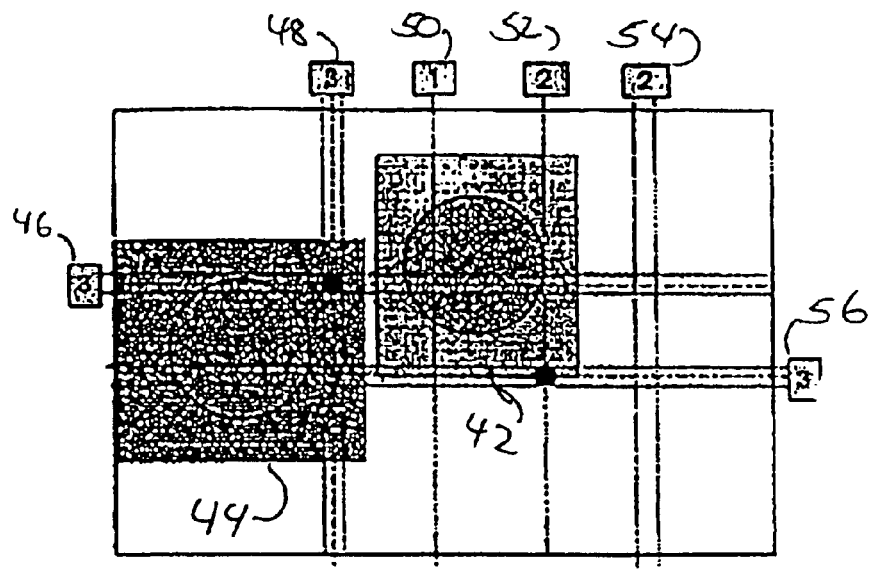

In step 208, further illustrated by FIG. 14(e), first wafer stage 42 is switching in the Y direction and its X position is controlled by interferometer 56a, its Y position by 50, and Yaw is controlled by interferometer 52 and 50. Second wafer stage 44 is waiting for interferometer 56c to become available to control its X position and its Y position is controlled by interferometer 48, and its Yaw by interferometer 48.

Figure 14F:
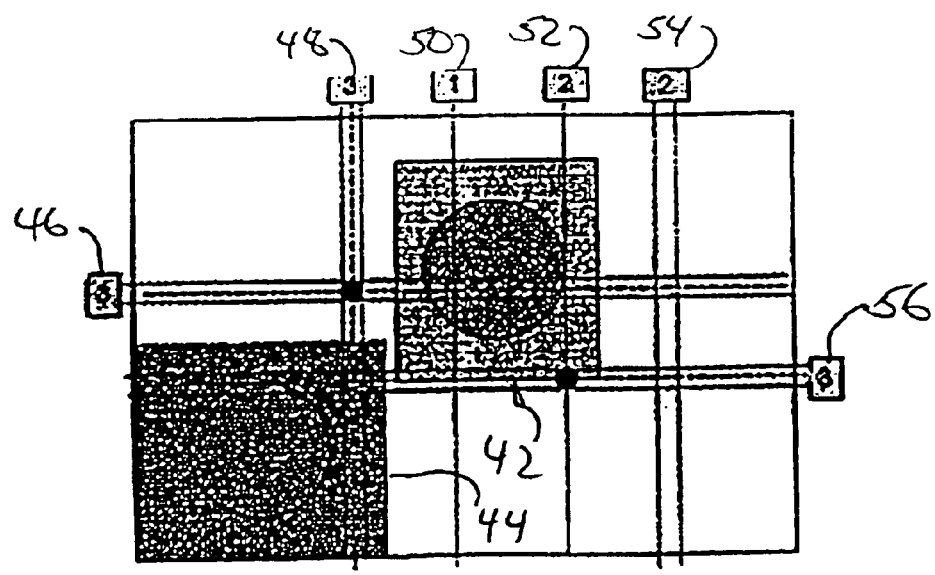

In step 210, further illustrated by FIG. 14(f), first wafer stage 42 is waiting for interferometer 46 to become available to control its X position. Its Y position is controlled by interferometer 50, and Yaw is controlled by interferometer 52. Second wafer stage 44 is switching in the Y direction and its X position is controlled by interferometer 56c, its Y position by interferometer 48, and its Yaw by interferometer 48.

Figure 14G:
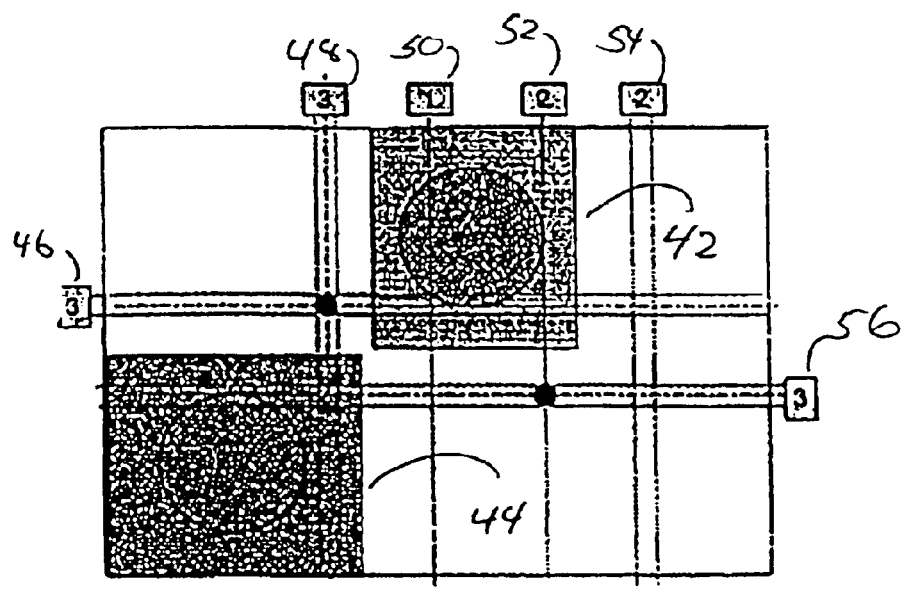

In step 212, further illustrated by FIG. 14(g), first wafer stage 42 is switching in the Y direction and its X position is controlled by interferometer 46, its Y position by 50, and Yaw is controlled by interferometer 46. Second wafer stage 44 is switching in the Y direction and its X position is controlled by interferometer 56c changing to interferometer 56, its Y position by interferometer 48, and its Yaw by interferometer 48 changing to interferometer 56.

Figure 13A:
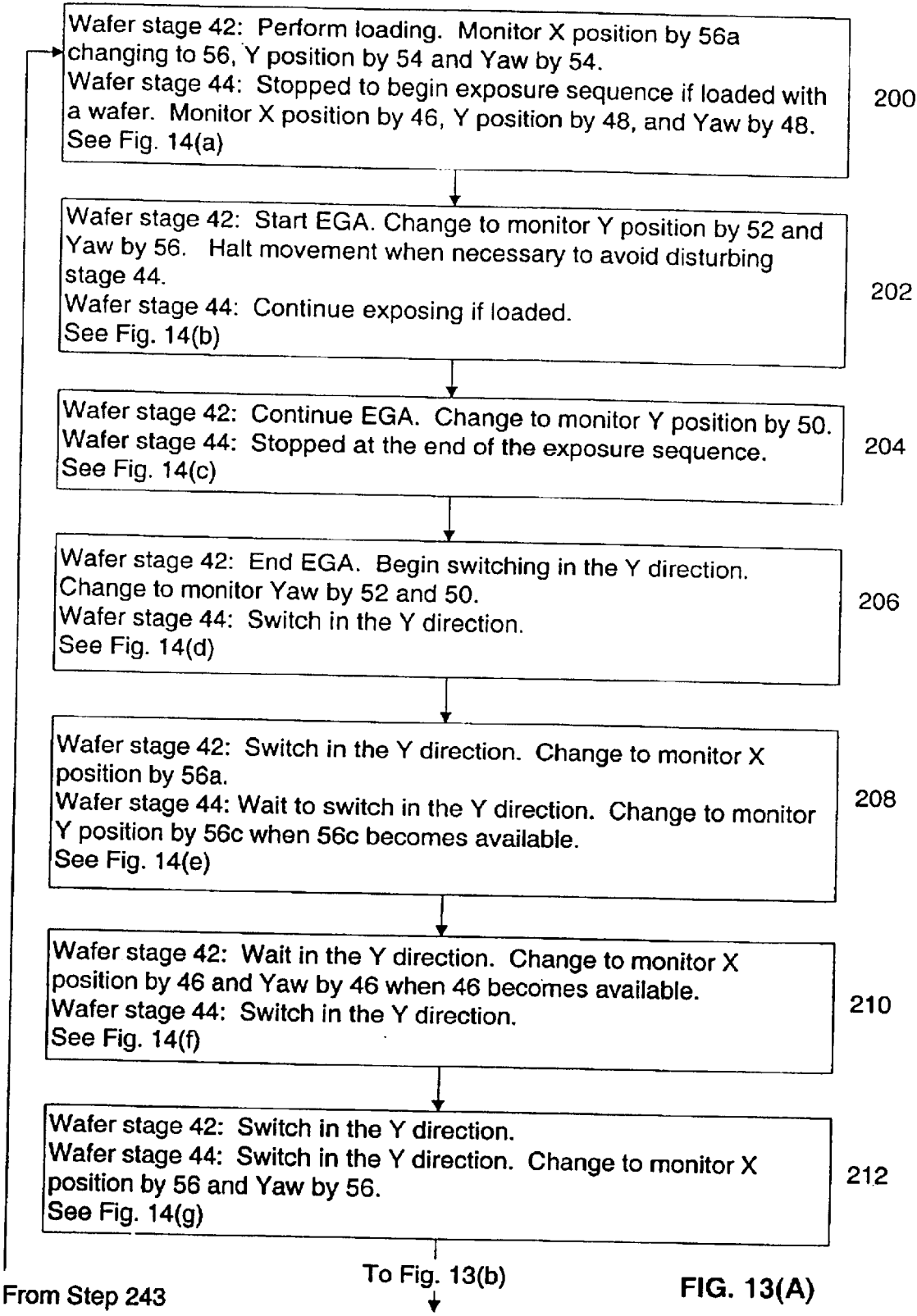
FIG. 13(a)–(e) is a flowchart illustrating a method according to the present invention.
Figure 13B:
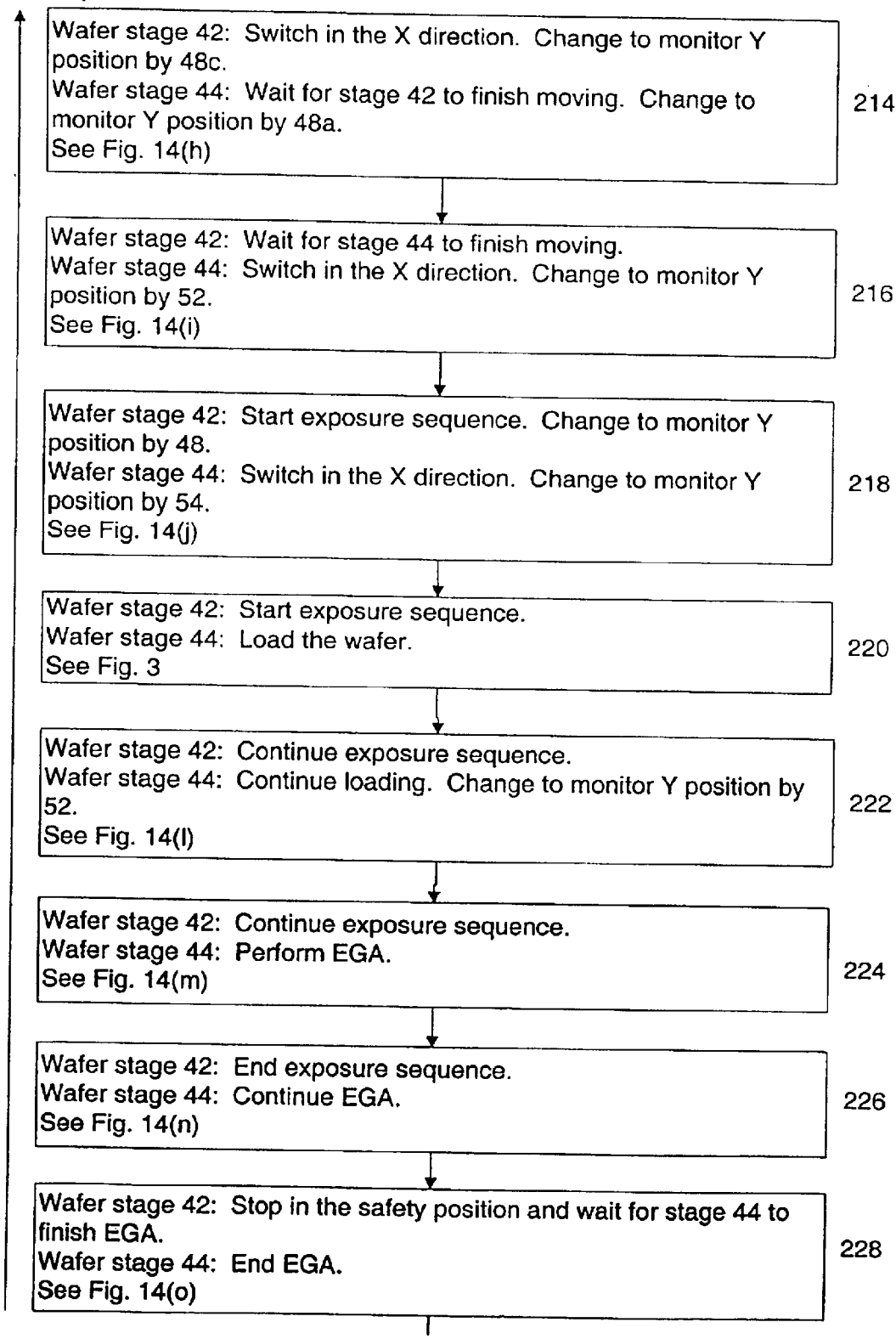
Figure 14H:
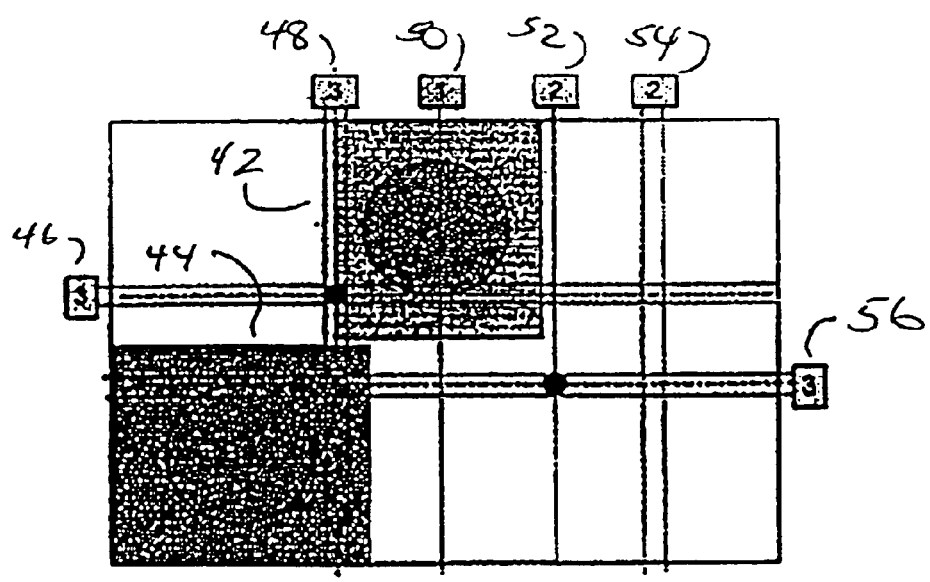

Now referring to FIG. 13(b), in step 214, further illustrated by FIG. 14(h), first wafer stage 42 is switching in the X direction and its X position is controlled by interferometer 46, its Y position by interferometer 52 changing to interferometer 48c, and Yaw is controlled by interferometer 46. Second wafer stage 44 is waiting for stage 42 to finish moving. Its X position is controlled by interferometer 56, its Y position by interferometer 48 changing to interferometer 48a, and its Yaw by interferometer 56.

Figure 14I:
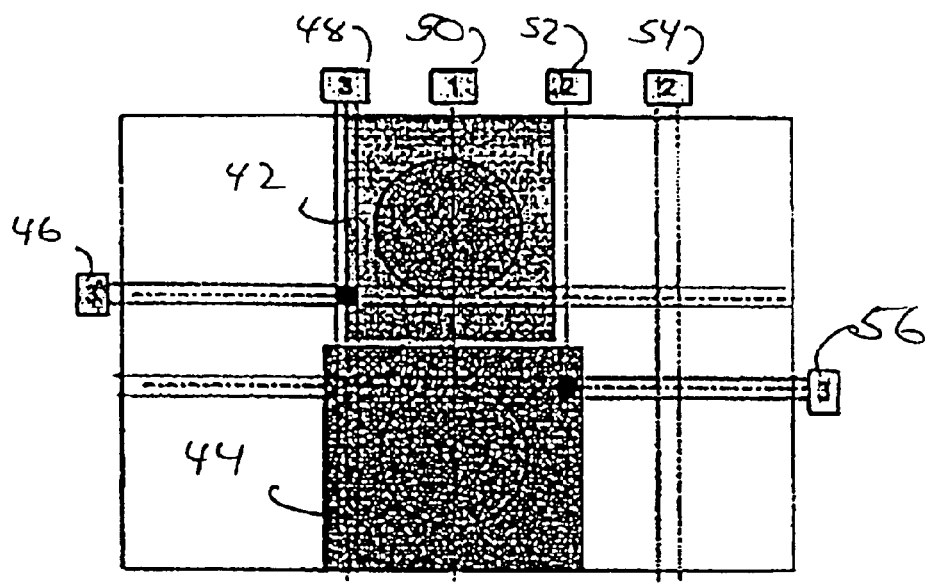

In step 216, further illustrated by FIG. 14(i), first wafer stage 42 is now stopped and waiting for stage 44 to finish moving. Its X position is controlled by interferometer 46, its Y position by interferometer 48c, and Yaw is controlled by interferometer 46. Second wafer stage 44 is switching in the X direction and its X position is controlled by interferometer 56, its Y position by interferometer 48a changing to interferometer 52, and its Yaw by interferometer 56.

Figure 14J:
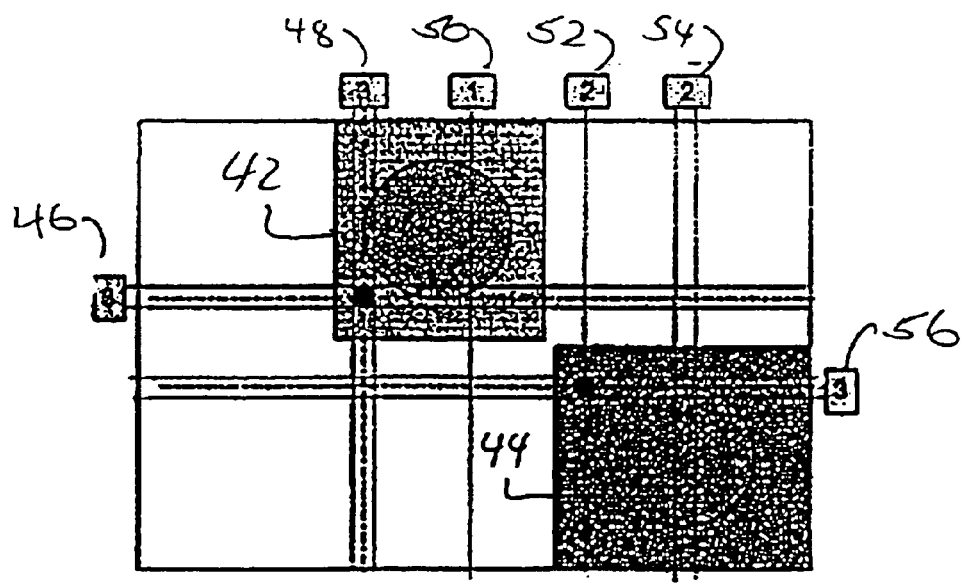

In step 218, further illustrated by FIG. 14(j), first wafer stage 42 is starting the exposure sequence and its X position is controlled by interferometer 46, its Y position by interferometer 48c changing to interferometer 48, and Yaw is controlled by interferometer 46. Second wafer stage 44 is switching in the X direction and its X position is controlled by interferometer 56, its Y position by interferometer 52 changing to interferometer 54, and its Yaw by interferometer 56.

Figure 14K:
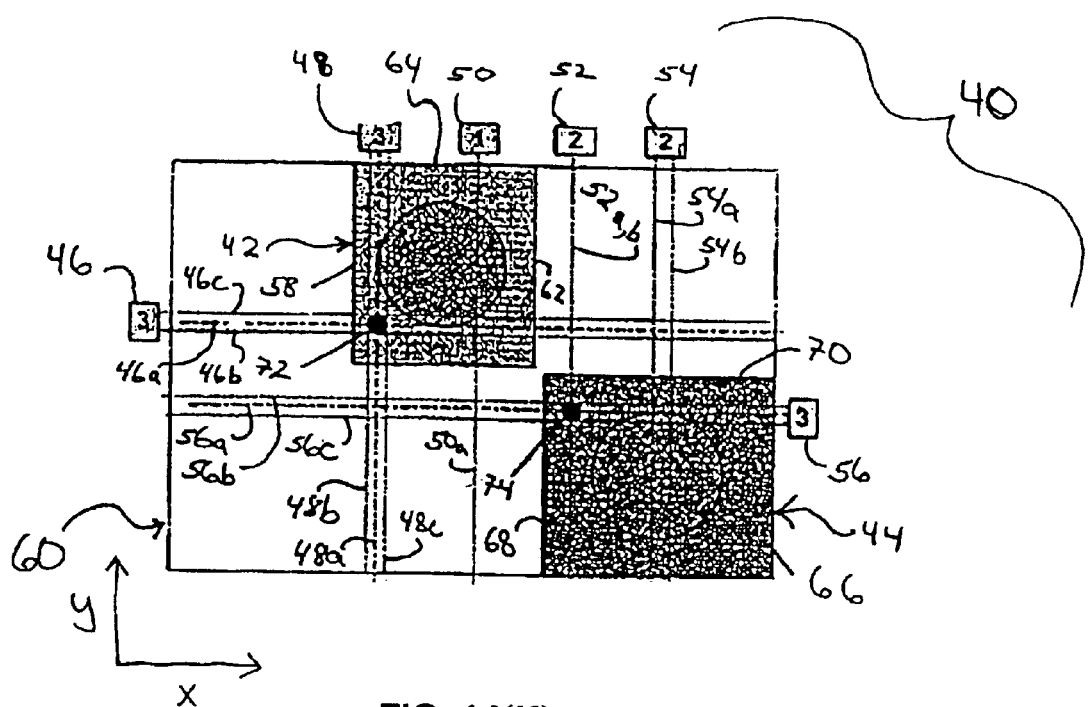

In step 220, further illustrated by FIG. 14(k) (also known as FIG. 3), first wafer stage 42 is starting the exposure sequence and its X position is controlled by interferometer 46, its Y position by interferometer 48, and Yaw is controlled by interferometer 46. Second wafer stage 44 is loading or unloading and its X position is controlled by interferometer 56, its Y position by interferometer 54, and its Yaw by interferometer 56.

Figure 14L:
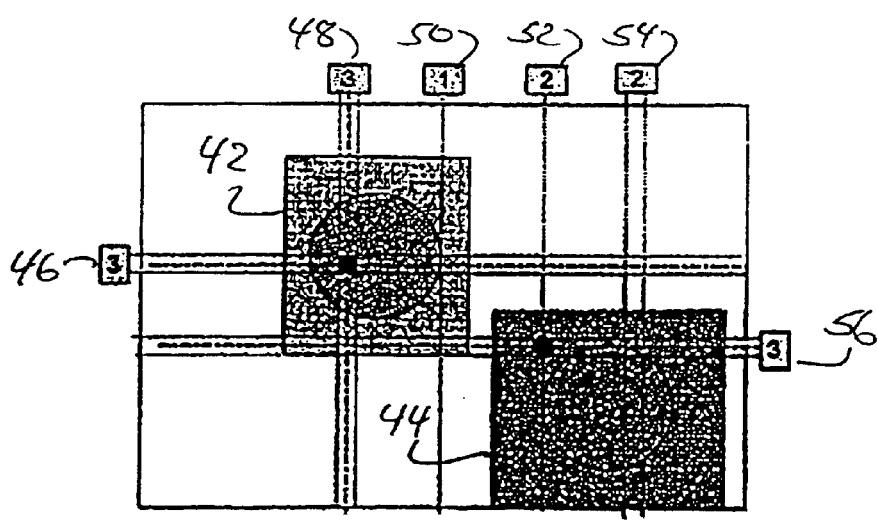

In step 222, further illustrated by FIG. 14(l), first wafer stage 42 is in the exposure sequence and its X position is controlled by interferometer 46, its Y position by interferometer 48, and its Yaw by interferometer 46. Second wafer stage 44 is still stopped and loading or unloading. Its X position is controlled by interferometer 56, its Y position by interferometer 54 changing to interferometer 52, and Yaw is controlled by interferometer 56.

Figure 14M:
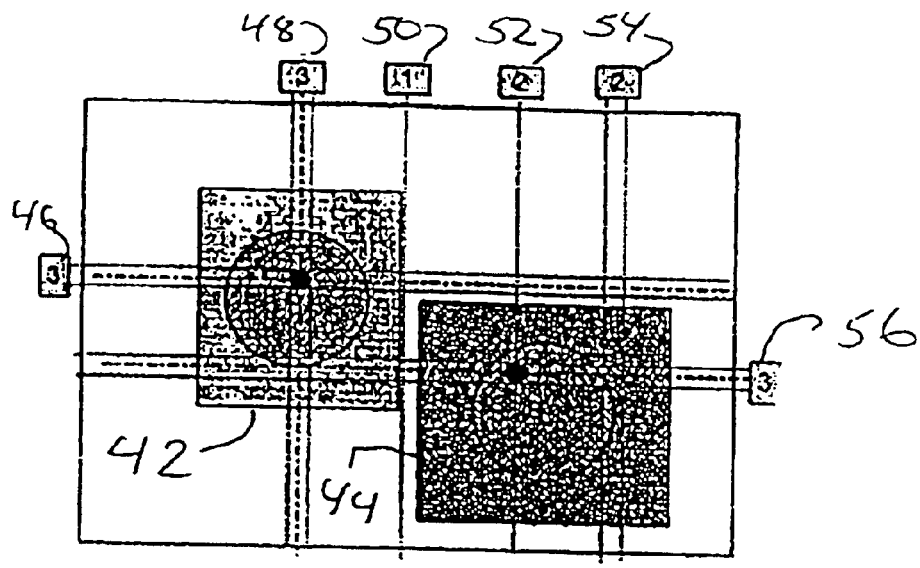

In step 224, further illustrated by FIG. 14(m), first wafer stage 42 is in the exposure sequence and its X position is controlled by interferometer 46, its Y position by interferometer 48, and Yaw is controlled by interferometer 46. Second wafer stage 44 is in enhanced global alignment and its X position is controlled by interferometer 56, its Y position by interferometer 52, and its Yaw by interferometer 56.

Figure 14N:
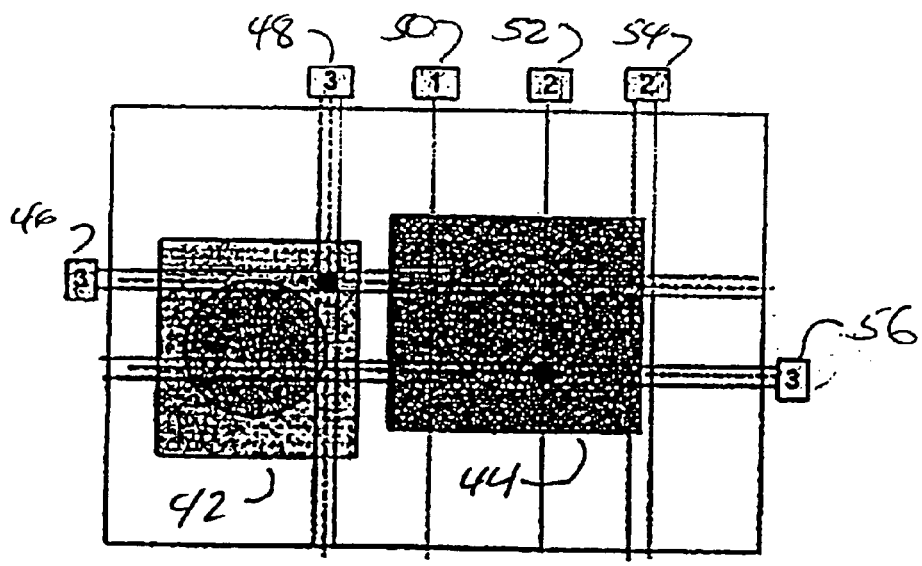
Figure 14O:
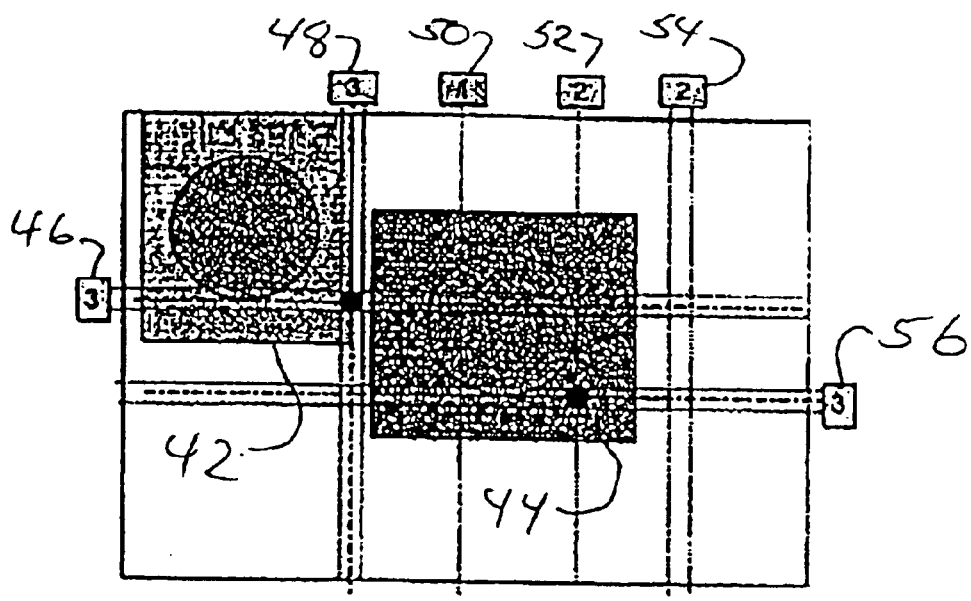

In step 226, further illustrated by FIG. 14(n), first wafer stage 42 is ending the exposure sequence and its X position is controlled by interferometer 46, its Y position by interferometer 48, and Yaw is controlled by interferometer 46. Second wafer stage 44 is in enhanced global alignment and its X position is controlled by interferometer 56, its Y position by interferometer 52, and its Yaw by interferometer 56.

In step 228, further illustrated by FIG. 14(o), first wafer stage 42 is stopped in the safety position waiting for stage 44 to finish EGA and its X position is controlled by interferometer 46, its Y position by interferometer 48a, and Yaw is controlled by interferometer 46. Second wafer stage 44 is ending enhanced global alignment and its X position is controlled by interferometer 56, its Y position by interferometer 52, and its Yaw by interferometer 56.

Figure 13C:
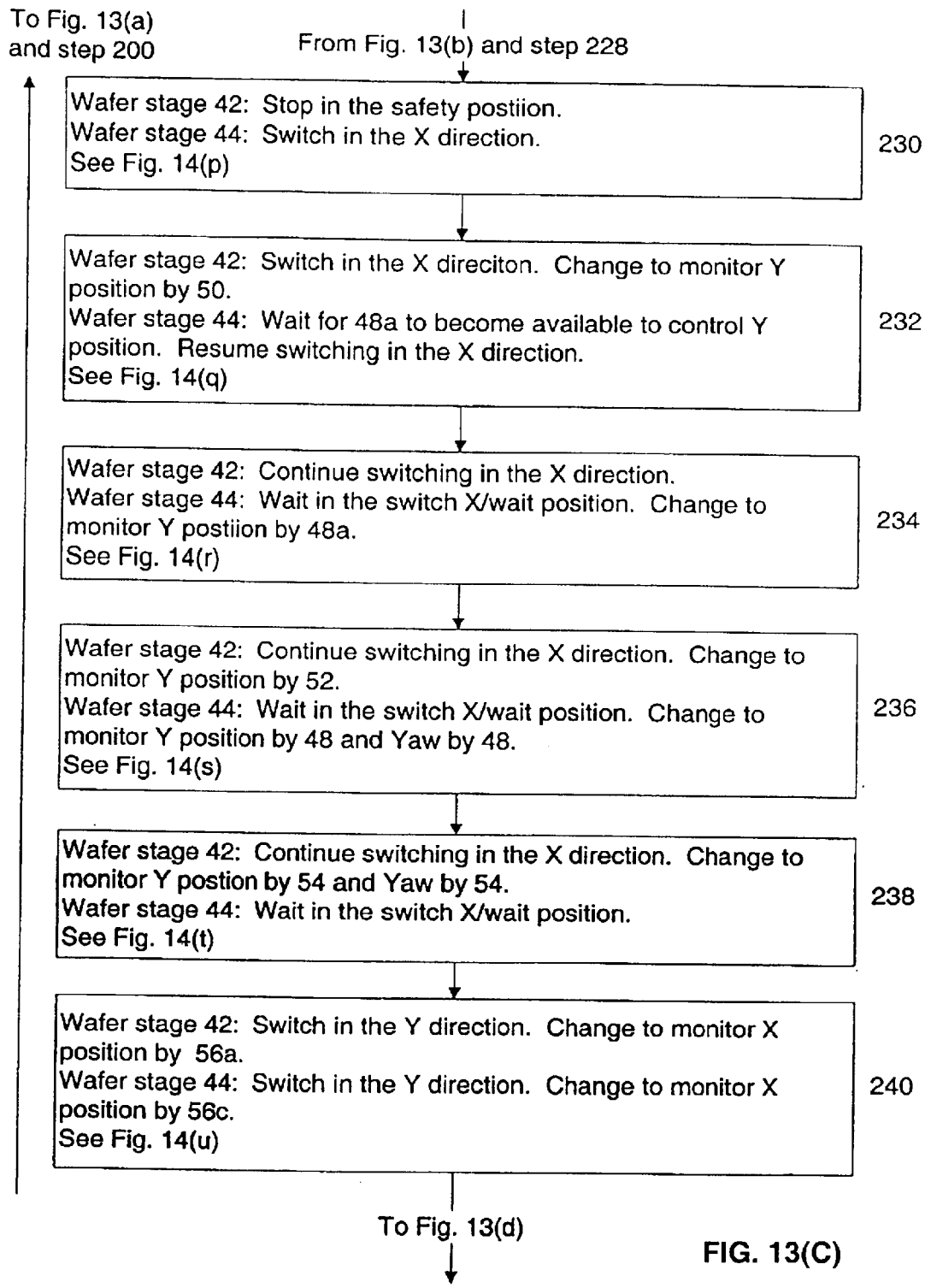
Figure 14P:
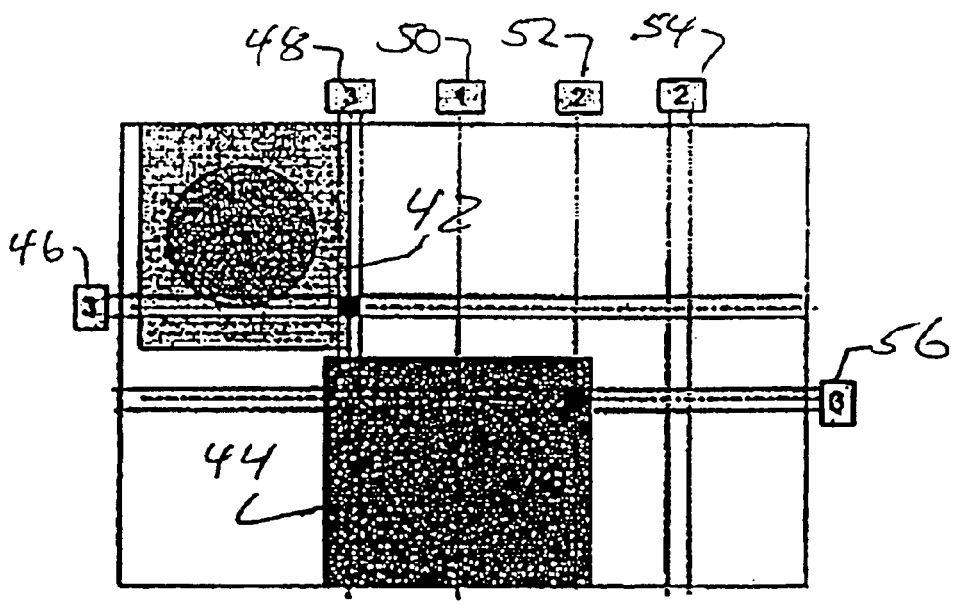

Now referring to FIG. 13(c), in step 230, further illustrated by FIG. 14(p), first wafer stage 42 is stopped in the safety position and its X position is controlled by interferometer 46, its Y position by interferometer 48b, and Yaw is controlled by interferometer 46. Second wafer stage 44 is switching in the X direction and its X position is controlled by interferometer 56, its Y position by interferometer 52, and its Yaw by interferometer 56.

Figure 14Q:
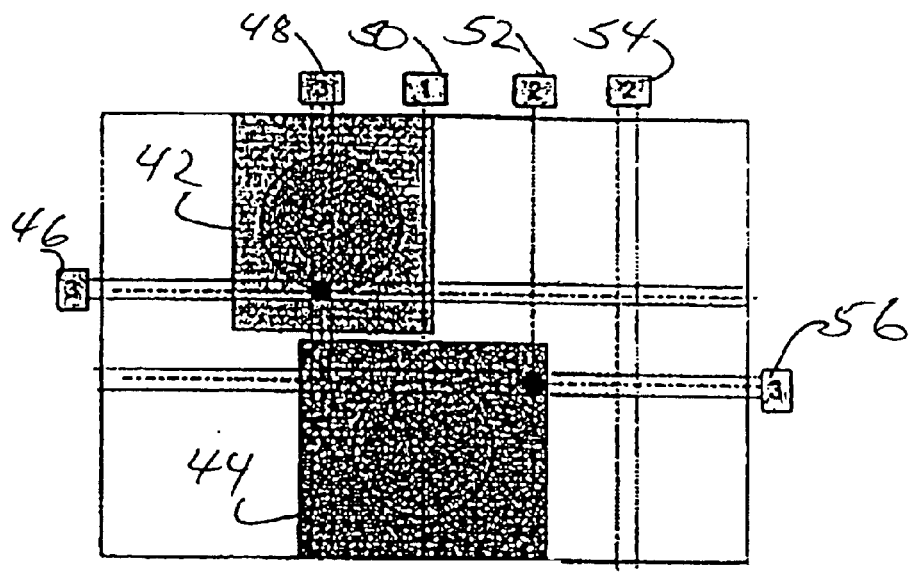

In step 232, further illustrated by FIG. 14(q), first wafer stage 42 is switching in the X direction and its X position is controlled by interferometer 46, its Y position by interferometer 48b changing to 50, and Yaw is controlled by interferometer 46. Second wafer stage 44 is waiting for interferometer 48a to become available and its X position is controlled by interferometer 56, its Y position by interferometer 52, and its Yaw by interferometer 56.

Figure 14R:
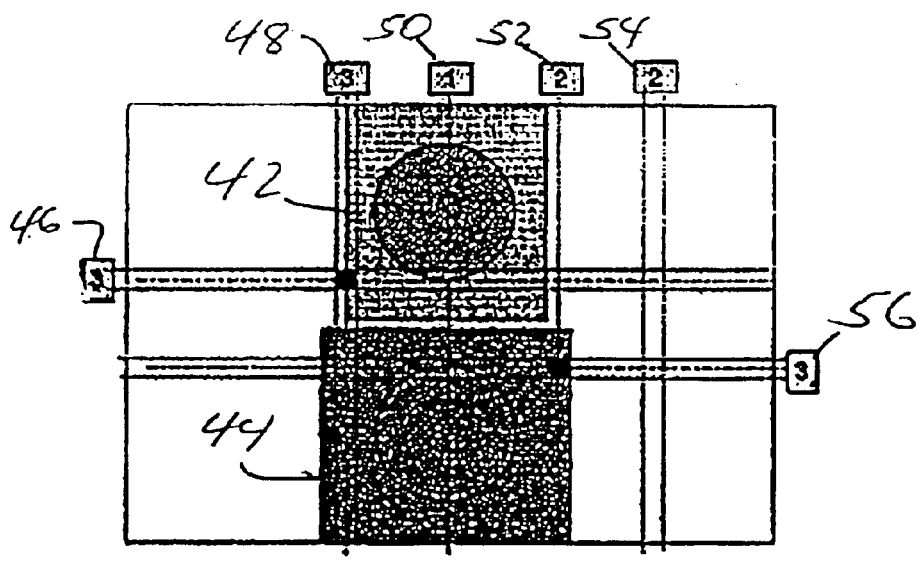

In step 234, further illustrated by FIG. 14(r), first wafer stage 42 is switching in the X direction and its X position is controlled by interferometer 46, its Y position by 50, and Yaw is controlled by interferometer 46. Second wafer stage 44 is waiting in the switch X/wait position and its X position is controlled by interferometer 56, its Y position by interferometer 52 changing to interferometer 48a, and its Yaw by interferometer 56.

Figure 14S:
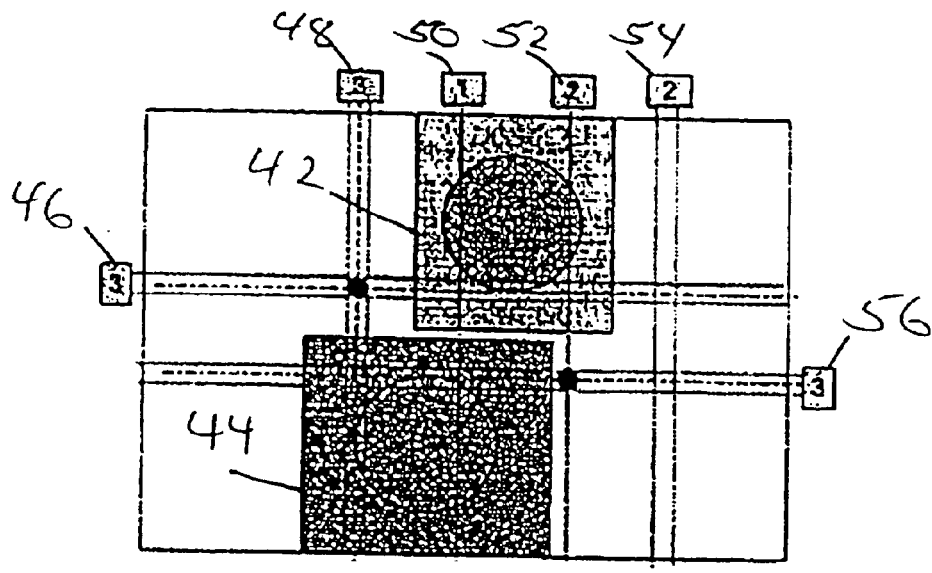

In step 236, further illustrated by FIG. 14(s), first wafer stage 42 is switching in the X direction and its X position is controlled by interferometer 46, its Y position by interferometer 50 changing to interferometer 52, and Yaw is controlled by interferometer 46. Second wafer stage 44 is in the waiting in the X direction and its X position is controlled by interferometer 56, its Y position by interferometer 48b changing to interferometer 48, and its Yaw by interferometer 56 changing to interferometer 48.

Figure 14T:
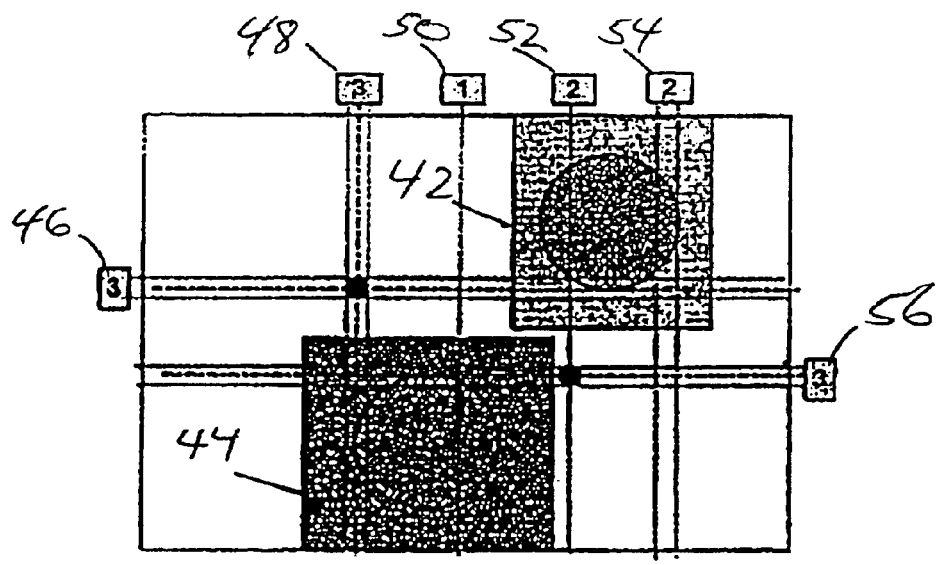

In step 238, further illustrated by FIG. 14(t), first wafer stage 42 is switching in the X direction and its X position is controlled by interferometer 46, its Y position by interferometer 52 changing to interferometer 54, and Yaw is controlled by interferometer 46 changing to interferometer 54. Second wafer stage 44 is waiting and its X position is controlled by interferometer 56, its Y position by interferometer 48, and its Yaw by interferometer 48.

Figure 14U:
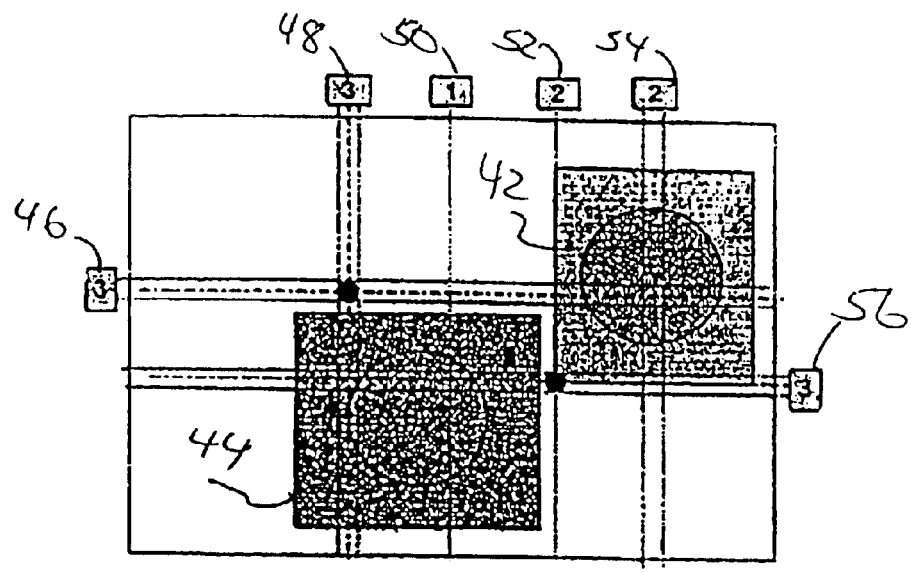

In step 240, further illustrated by FIG. 14(u), first wafer stage 42 is switching in the Y direction and its X position is controlled by interferometer 46 changing to interferometer 56a, its Y position by interferometer 54, and Yaw is controlled by interferometer 54. Second wafer stage 44 is switching in the Y direction and its X position is controlled by interferometer 56 changing to interferometer 56c, its Y position by interferometer 48, and its Yaw by interferometer 48.

Figure 13D:
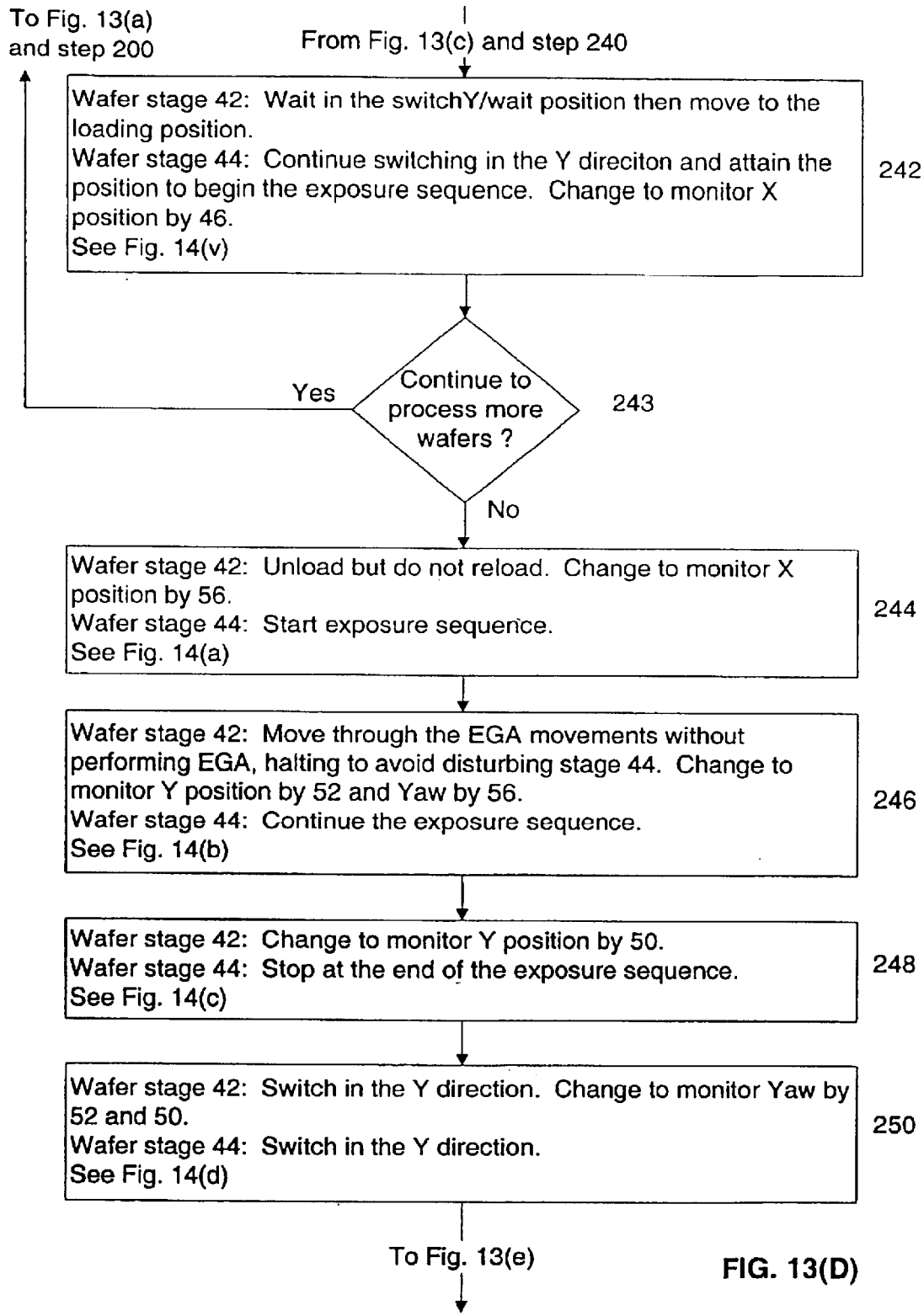
Figure 13E:
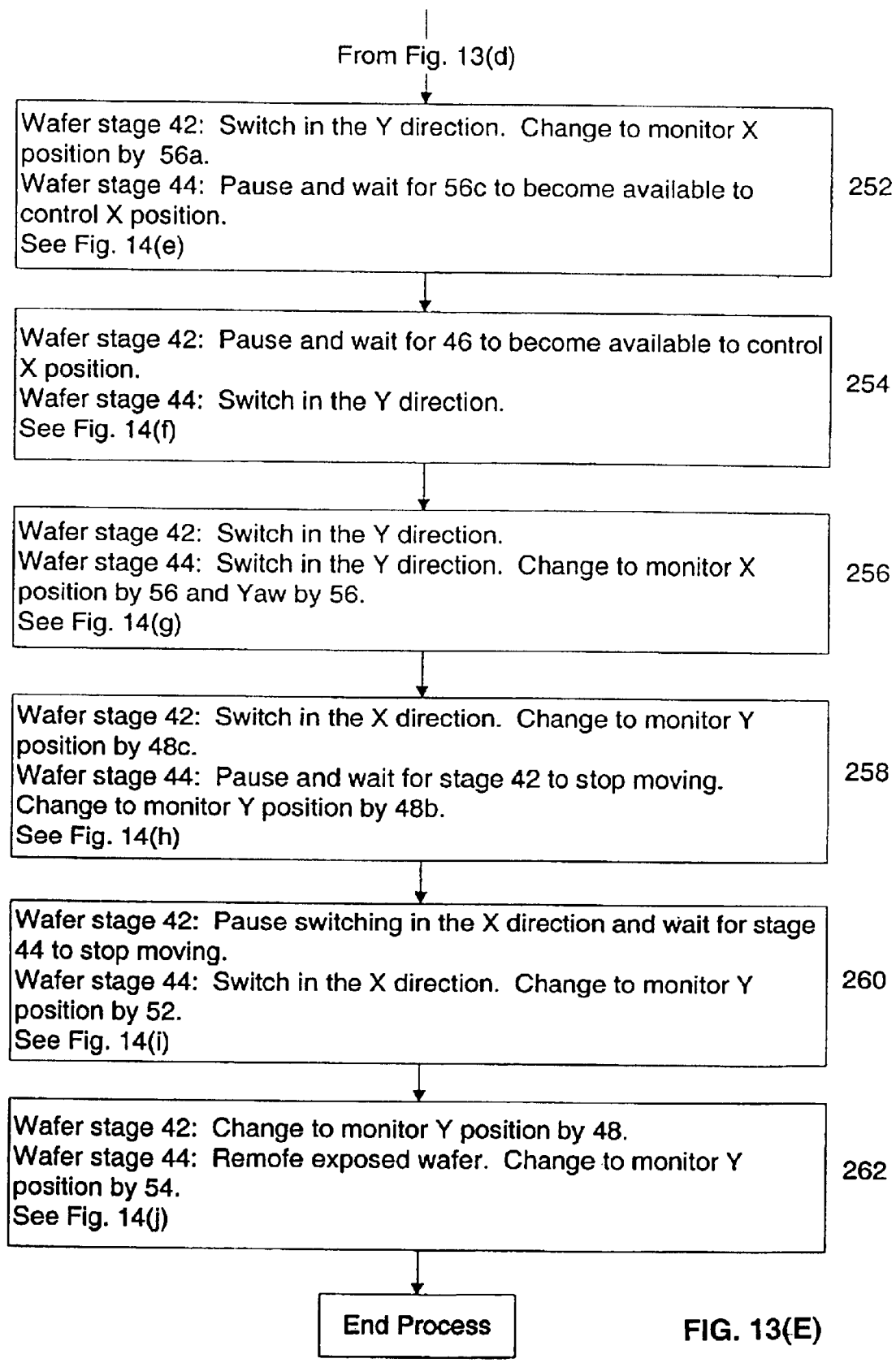
Figure 14V:
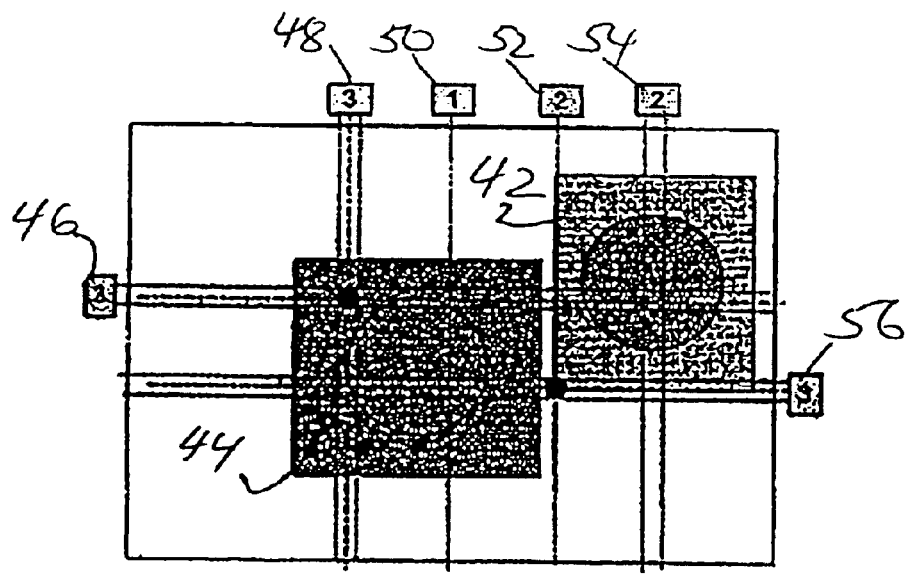

Now referring to FIG. 13(d), in step 242, further illustrated by FIG. 14(v), first wafer stage 42 is waiting in the switch Y/wait position before moving to the loading position and its X position is controlled by interferometer 56a, its Y position by interferometer 54, and Yaw is controlled by interferometer 54. Second wafer stage 44 is in position to begin the exposure sequence switching in the Y direction and its X position is controlled by interferometers 56c changing to interferometer 46, its Y position by interferometer 48, and its Yaw by interferometer 48.

Step 243 is the decision block for whether to continue to process more wafers. Should the answer be "yes" the method returns to step 200 and continues in sequence, otherwise the method continues to step 244 which is also illustrated by FIG. 14(a), except the actions taken account for the fact that wafer stage 42 is now empty.

In step 244, further illustrated by FIG. 14(a), first wafer stage 42 is unloaded but not reloaded. Its X position is controlled by interferometer 56a changing to interferometer 56, its Y position by interferometer 54, and Yaw is controlled by interferometer 54. Second wafer stage 44 is stopped to begin the exposure sequence and its X position is controlled by interferometer 46, its Y position by interferometer 48, and its Yaw by interferometer 48.

In step 246, further illustrated by FIG. 14(b), first wafer stage 42 X position is controlled by interferometer 56, its Y position by interferometer 54 changing to interferometer 52, and Yaw is controlled by interferometer 54 changing to interferometer 56. At times stage 42 is halted to avoid disturbing the movement of stage 44. Second wafer stage 44 is in the exposure sequence and its X position is controlled by interferometer 46, its Y position by interferometer 48, and its Yaw by interferometer 48.

In step 248, further illustrated by FIG. 14(c), first wafer stage 42 X position is controlled by interferometer 56, its Y position by interferometer 52 changing to 50, and Yaw is controlled by interferometer 56. Second wafer stage 44 is stopped at the end of the exposure sequence and its X position is controlled by interferometer 46, its Y position by interferometer 48, and its Yaw by interferometer 48.

In step 250, further illustrated by FIG. 14(d), first wafer stage 42 is switching in the direction. Its X position is controlled by interferometer 56, its Y position by 50, and Yaw is controlled by interferometer 56 changing to interferometer 52 and 50. Second wafer stage 44 is switching in the Y direction and its X position is controlled by interferometer 46, its Y position by interferometer 48, and its Yaw by interferometer 48.

In step 252, further illustrated by FIG. 14(e), first wafer stage 42 is switching in the direction and its X position is controlled by interferometer 56a, its Y position by 50, and Yaw is controlled by interferometer 52 and 50. Second wafer stage 44 is waiting for interferometer 56c to become available to control its X position and its Y position is controlled by interferometer 48, and its Yaw by interferometer 48.

In step 254, further illustrated by FIG. 14(f), first wafer stage 42 is waiting for interferometer 46 to become available to control its X position. Its Y position is controlled by 50, and Yaw is controlled by interferometer 52. Second wafer stage 44 is switching in the Y direction and its X position is controlled by interferometer 56c, its Y position by interferometer 48, and its Yaw by interferometer 48.

In step 256, further illustrated by FIG. 14(g), first wafer stage 42 is switching in the Y direction and its X position is controlled by interferometer 46, its Y position by 50, and Yaw is controlled by interferometer 46. Second wafer stage 44 is switching in the Y direction and its X position is controlled by interferometer 56c changing to interferometer 56, its Y position by interferometer 48, and its Yaw by interferometer 48 changing to interferometer 56.

In step 258, further illustrated by FIG. 14(h), first wafer stage 42 is switching in the X direction and its X position is controlled by interferometer 46, its Y position by interferometer 52 changing to interferometer 48c, and Yaw is controlled by interferometer 46. Second wafer stage 44 is waiting for stage 42 to finish moving. Its X position is controlled by interferometer 56, its Y position by interferometer 48 changing to interferometer 48b, and its Yaw by interferometer 56.

In step 260, further illustrated by FIG. 14(i), first wafer stage 42 is now stopped and waiting for stage 44 to finish moving. Its X position is controlled by interferometer 46, its Y position by interferometer 48c, and Yaw is controlled by interferometer 46. Second wafer stage 44 is switching in the X direction and its X position is controlled by interferometer 56, its Y position by interferometer 48a changing to interferometer 52, and its Yaw by interferometer 56.

In step 262, further illustrated by FIG. 14(j), first wafer stage 42 is not beginning the exposure sequence since it was not loaded. Its X position is controlled by interferometer 46, its Y position by interferometer 48c changing to interferometer 48, and Yaw is controlled by interferometer 46. Second wafer stage 44 is unloading X position is controlled by interferometer 46, its Y position by interferometer 48, and its Yaw by interferometer 48. The unloading of second wafer stage 44 ends the method.

The use of the exposure apparatus and dual wafer stage assembly described herein is not limited to a lithography system for semiconductor manufacturing. This arrangement may be employed advantageously in other assemblies wherein objects other than wafers must be precisely positioned while they are processed simultaneously. The apparatus, for example, can be used as an LCD lithography system that exposes a liquid crystal display device pattern onto a rectangular glass plate or a lithography system for manufacturing a thin film magnetic head. Furthermore, the exposure apparatus and dual wafer stage assembly can also be applied to a proximity lithography system that exposes a reticle pattern by closely locating a reticle and a substrate without the use of a lens assembly. Additionally, an exposure apparatus utilizing a dual wafer stage assembly according to the invention can be used in other devices, including other semiconductor processing equipment, machine tools, metal cutting machines, and inspection machines.

It is to be understood that while illustrative embodiments of the invention have been shown and described herein, various changes and adaptions in accordance with the teachings of the invention will be apparent to those of skill in the art. Such changes and adaptions nevertheless are included within the spirit and scope of the invention as defined in the following claims.

I claim:

1. A dual wafer stage assembly, comprising:
   a base;
   a first stage movable in a plane on said base to a series of first positions;
   a second stage movable in said plane on said base to a series of second positions, where said first positions and said second positions are coextensive;
   a plurality of interferometers mounted on said base with a corresponding plurality of moveable mirrors mounted on said first stage and said second stage wherein said interferometers, said first and said second stages, and said moveable mirrors are configured and dimensioned to allow for continuous determination of a position of each said stage at any position even where said first stage eclipses said second stage with respect to at least one of said plurality of interferometers.

2. A dual wafer stage assembly according to claim 1, wherein said first and said second stages differ in dimension when measured in the direction perpendicular to said plane.

3. A dual wafer stage assembly according to claim 1, wherein said first and said second stages differ in at least one dimension in said plane.

4. A dual wafer stage assembly according to claim 1, claim 2, or claim 3, wherein a first said moveable mirror on said first stage and a second said moveable mirror on said second stage reflect alternatively to a common subset of said plurality of interferometers and where said second moveable mirror is larger than said first moveable mirror in at least one dimension such that a region is created where said second moveable mirror is larger than said first moveable mirror and where at least one of said plurality of interferometers utilizes said region in the continuous determination of the position of said second stage.

5. A dual wafer stage assembly according to claim 4, wherein said second stage and said second moveable mirror are the same dimensions in the plane of said second moveable mirror.

6. A dual wafer stage assembly according to claim 4, wherein said second moveable mirror is sectioned with at least one of said sections offset from the other said section in the direction parallel to the axes of said subset of interferometers.

7. A dual wafer stage assembly according to claim 6, wherein said second moveable mirror is sectioned such that one of said sections is approximately the same dimensions as said stage supporting said section.

8. A dual stage assembly, comprising:
   a base;
   a plurality of interferometers mounted on said base for determination of stage positions, said interferometers each including at least one interferometer axis directed towards a moveable mirror;
   a first stage moveable in a plane between multiple positions on said base and having at least a first moveable mirror mounted thereon; and
   a second stage moveable in said plane between multiple positions on said base and having at least a second moveable mirror mounted thereon, said first and second stages being moveable to positions wherein the first stage eclipses the second stage with respect to said at least one said interferometer;
   wherein said first and second moveable mirrors are configured to reflect to a common subset of interferometer axes, said second moveable mirror having a reflecting surface that cooperates with said interferometers in said eclipsing positions such that the position of said second stage is continuously determinable.

9. A dual stage assembly according to claim 8, wherein said first moveable mirror's reflecting surface eclipses said first stage from said common subset of interferometers.

10. A dual stage assembly according to claim 9, wherein said second moveable mirror's reflecting surface eclipses said second stage from said common subset of interferometers.

11. A dual wafer stage assembly according to claim 8, wherein the reflecting surface of at least one of said moveable mirrors is comprised of sections.

12. A dual wafer stage assembly according to claim 8, wherein the reflecting surface of at least one of said moveable minors is comprised of sections and at least one of said sections is not co-planar with the remaining sections.

13. A dual wafer stage assembly according to claim 8, wherein said second moveable mirror extends beyond said second stage along the dimension defined by the intersection of the plane of said mirror and the plane of said stage.

14. A dual wafer stage assembly, comprising:
   a base;
   a first stage movable in a plane on said base;
   a second stage movable in said plane on said base; and
   a plurality of interferometers mounted along one side of said base which are directed to a first moveable minor mounted on said first stage and a second moveable minor mounted on said second stage where said plurality of interferometers and moveable mirrors cooperate to continuously determine the position of both said stages such that if said first stage is interposed between second said stage and at least one of said interferometers said second stage position is determined by at least one other of said interferometers.

15. A dual wafer stage assembly according to claim 14, wherein said second moveable minor is larger than said first moveable minor in a dimension of said mirrors' reflecting surface.

16. A dual wafer stage assembly according to claim 15, wherein said second stage and said second moveable minor's reflecting surface are of approximately the same dimensions.

17. A dual wafer stage assembly according to claim 14, further comprising:
   a second plurality of interferometers are mounted along a second side of said base where said second side is perpendicular to said first side of said base;
   a third moveable minor mounted on said first stage and a fourth moveable minor mounted on said second stage where said second plurality of interferometers and said third and said fourth moveable minors cooperate to continuously determine the position of both said stages such that if said first stage is interposed between second said stage and at least one of said second plurality of interferometers said second stage position is determined by at least one other of said second plurality of interferometers.

18. A dual wafer stage assembly, comprising:
   a base;
   a first stage movable in a plane on said base;
   a second stage movable in said plane on said base wherein said second stage is larger than said first stage in at least one dimension of said plane; and
   a plurality of interferometers and moveable mirrors wherein said interferometers are mounted on said base and said moveable mirrors are mounted on said first and said second stages and said interferometers and said moveable mirrors are configured to facilitate the continuous determination of the positions of said stages, and where one or more portions of said moveable mirrors mounted on said second stage are located on said second stage where said second stage is larger than said first stage.

19. A method of utilizing a dual stage assembly where stage position is determined using interferometers, the method comprising:

sizing a first stage and a second stage based on a determined size and exposure apparatus parameters;
providing a plurality of interferometers directed in parallel at said stages and dispersed along one side of an area in which said stages will travel such that each of said stages' positions intersect an axis created by at least one of said plurality of interferometers at all times during the movement of said stages;
equipping said first stage with a first movable mirror dimensioned to allow said interferometers to determine said first stage's position in a first desired direction;
equipping said second stage with a second movable mirror dimensioned to allow at least one of said plurality of interferometers to determine said second stage's position in said first desired direction even if said first stage should be positioned between said second stage and said dispersed interferometers;
moving said first and said second stages in said area; and
determining said first stage's position and said second stage's position in said first direction using at least one of said plurality of interferometers for each of said stages' positions at all times.

20. A method of utilizing a dual stage assembly where stage position is determined using interferometers according to claim 19, the method further comprising:
   providing at least one first orthogonal interferometer directed at said stages from a second side of said area and directed orthogonally to said first plurality of interferometers;
   providing at least one second orthogonal interferometer directed at said stages from a third side of said area and directed orthogonally to said first plurality of interferometers and directed parallel to said at least one first orthogonal interferometer;
   equipping said first stage with a third moveable mirror and said second stage with a fourth moveable mirror, said third and fourth mirrors configured and dimensioned to reflect to said at least one first orthogonal interferometer;
   equipping said first stage with a fifth moveable mirror and said second stage with a sixth moveable mirror, said fifth and sixth mirrors configured and dimensioned to reflect to said at least one second orthogonal interferometer, said at least one first orthogonal interferometer and said at least one second orthogonal interferometer and said third, fourth, fifth, and sixth moveable mirrors configured to determine said first and said second stages' positions in said orthogonal direction at all times during said stages' movement; and
   determining said first stage's position and said second stage's position in said orthogonal direction at all times during said movement using said orthogonal interferometers.

21. An exposure apparatus that forms an image on a substrate, comprising:
   a base;
   a first operation area comprising a first optical device that performs a first operation on a first substrate;
   a second operation area being adjacent to the first operational area, the second operational area comprising a second optical device that performs a second operation on a second substrate, the second substrate having previously had the first operation performed on the second substrate in the first operation area;
   a stage system comprising a first stage and a second stage, the first and the second stages holding one of the first substrate and the second substrate and being movable on the base between the first operation area and the second operation area, respectively; and an interferometer system including a plurality of interferometers, the interferometer system constantly monitoring the position of the each of the first stage and the second stage at all times during the movement of the each stage from the second operation area to the first operation area wherein each stage that moves from the second operation area to the first operation area holds the second substrate that has had the second operation performed thereon in the second operation area.

22. The exposure apparatus of claim 21 wherein the interferometer system constantly monitoring the position of the each of the first stage and the second stage at all times during the movement of the each stage from the first operation area to the second operation area.

23. The exposure apparatus of claim 21 wherein the second operation area performs the second operation on the second substrate while the first operation area performs the first operation on the first substrate.

24. The exposure apparatus of claim 21 wherein the interferometer system monitors the position of the each of the first stage and the second stage in a first direction and a second direction that is perpendicular to the first direction respectively, and the first operation area and the second operation area are disposed with offset between each other in the first direction.

25. The exposure apparatus of claim 24 wherein the each of the first and the second stage has at least three mirrors that interact with the interferometer system respectively, a first mirror, a second mirror, and a third mirror are disposed on the first stage and fourth mirror, fifth mirror, and a sixth mirror are disposed on the second stage, wherein the reflect surfaces of the first, third, fourth, and sixth mirrors face the first direction and the reflect surfaces of the second and fifth mirrors face the second direction.

26. The exposure apparatus of claim 24 wherein the first operation area and the second operation area are disposed with offset between each other in the second direction.

27. The exposure apparatus of claim 21, wherein the second substrate that has had the second operation performed thereon in the second operation area is unloaded from each stage in the first operation area.

28. The exposure apparatus of claim 27, wherein the first substrate for the first operation is loaded onto one of the first and second stages in the first operation area.

* * * * *

UNITED STATES PATENT AND TRADEMARK OFFICE
CERTIFICATE OF CORRECTION

PATENT NO. : 6,785,005 B2
DATED : August 31, 2004
INVENTOR(S) : Fuyuhiko Inoue

It is certified that error appears in the above-identified patent and that said Letters Patent is hereby corrected as shown below:

Column 15,
Lines 6 and 42, delete "minors" and insert -- mirrors --.
Lines 17, 19, 27, 28, 39 and 40, delete "minor" and insert -- mirror --.
Line 32, delete "minor's" and insert -- mirrors --.

Column 17,
Line 9, after "area", insert -- , --.

Signed and Sealed this

Seventh Day of December, 2004

JON W. DUDAS
*Director of the United States Patent and Trademark Office*